United States Patent
Chu et al.

(10) Patent No.: US 12,120,919 B2
(45) Date of Patent: Oct. 15, 2024

(54) DISPLAY APPARATUS AND METHOD OF MANUFACTURING THE SAME

(71) Applicant: Samsung Display Co., Ltd., Yongin-si (KR)

(72) Inventors: Jaehwan Chu, Yongin-si (KR); Meejae Kang, Yongin-si (KR); Keunwoo Kim, Yongin-si (KR); Doona Kim, Yongin-si (KR); Sangsub Kim, Yongin-si (KR); Hanbit Kim, Yongin-si (KR); Dokyeong Lee, Yongin-si (KR); Yongsu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 421 days.

(21) Appl. No.: 17/679,691

(22) Filed: Feb. 24, 2022

(65) Prior Publication Data
US 2022/0399420 A1 Dec. 15, 2022

(30) Foreign Application Priority Data
Jun. 11, 2021 (KR) .................. 10-2021-0076235

(51) Int. Cl.
*H10K 59/12* (2023.01)
*H10K 59/121* (2023.01)

(52) U.S. Cl.
CPC ..... *H10K 59/1213* (2023.02); *H10K 59/1216* (2023.02); *H10K 59/1201* (2023.02)

(58) Field of Classification Search
CPC ........... H10K 59/1213; H10K 59/1216; H10K 59/1201; H10K 59/123; H10K 59/121;
(Continued)

(56) References Cited

U.S. PATENT DOCUMENTS 7,700,995 B2 4/2010 Yasumatsu
9,171,892 B2 10/2015 Kwon et al.
(Continued)

FOREIGN PATENT DOCUMENTS

JP 5154951 2/2013
KR 10-0943187 2/2010
(Continued)

*Primary Examiner* — Kyoung Lee
(74) *Attorney, Agent, or Firm* — KILE PARK REED & HOUTTEMAN PLLC

(57) ABSTRACT

A method of manufacturing a display apparatus includes forming a first photosensitive pattern and a second photosensitive pattern of different thicknesses on an active layer; forming a driving semiconductor layer and a compensation semiconductor layer using the first photosensitive pattern and the second photosensitive pattern as masks to etch the active layer; exposing an upper surface of the driving semiconductor layer by etching the first photosensitive pattern and forming a third photosensitive pattern by etching at least a portion of the second photosensitive pattern; forming a first insulating layer on the driving semiconductor layer and the third photosensitive pattern; exposing an upper surface of the compensation semiconductor layer by stripping the third photosensitive pattern; and forming a second insulating layer on the first insulating layer and the compensation semiconductor layer.

20 Claims, 17 Drawing Sheets

(58) Field of Classification Search
CPC ......... H10K 59/124; G09G 2300/0426; G09G 2300/043
See application file for complete search history.

(56) References Cited

U.S. PATENT DOCUMENTS

| | | |
|---|---|---|
| 9,202,823 B2 | 12/2015 | So et al. |
| 9,356,260 B2 | 5/2016 | Hsu |
| 9,391,292 B2 | 7/2016 | Choi et al. |
| 2015/0130691 A1* | 5/2015 | Jeon ..................... G09G 3/3225 |
| | | 345/82 |

FOREIGN PATENT DOCUMENTS

| | | |
|---|---|---|
| KR | 10-1837322 | 3/2018 |
| KR | 10-2184448 | 12/2020 |

* cited by examiner

DISPLAY APPARATUS AND METHOD OF MANUFACTURING THE SAME

CROSS-REFERENCE TO RELATED APPLICATION(S)

This application claims priority to and benefits of Korean Patent Application No. 10-2021-0076235 under 35 U.S.C. § 119, filed on Jun. 11, 2021, in the Korean Intellectual Property Office, the entire contents of which are incorporated herein by reference.

BACKGROUND

1. Technical Field

One or more embodiments relate to a display apparatus and a method of manufacturing the same, and, to a display apparatus displaying high-quality images and a method of manufacturing the same.

2. Description of the Related Art

In general, a display apparatus may include pixels, and each of the pixels may include a display element and a pixel circuit for controlling the display element. The pixel circuit may include a thin-film transistor (TFT), a storage capacitor, and wires.

To accurately control whether to allow light emission from the display element and the luminescence level of the light emission, the number of TFTs electrically connected to one display element has increased.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Display apparatuses of the related art have a problem in that high-quality images are hardly displayed.

To solve various problems including the aforementioned problems, one or more embodiments provide a display apparatus capable of displaying high-quality images and a method of manufacturing the same. However, such problems are merely examples, and the disclosure is not limited thereto.

Additional aspects will be set forth in part in the description which follows and, in part, will be apparent from the description, or may be learned by practice of the embodiments of the disclosure.

A display apparatus may include a driving thin-film transistor including a driving channel region; and a driving gate electrode that at least partially overlaps the driving channel region; a compensation thin-film transistor including a compensation channel region; and a compensation gate electrode that at least partially overlaps the compensation channel region, the compensation thin-film transistor being diode-connected to the driving thin-film transistor in response to a voltage applied to the compensation gate electrode; a first insulating layer disposed between the driving channel region and the driving gate electrode of the driving thin-film transistor; and a second insulating layer disposed between the first insulating layer and the driving gate electrode and disposed between the compensation channel region and the compensation gate electrode of the compensation thin-film transistor, and a width of the compensation channel region of the compensation thin-film transistor is less than a width of the driving channel region of the driving thin-film transistor.

The display apparatus may further include a first initialization thin-film transistor including a first initialization channel region; and a first initialization gate electrode that at least partially overlaps the first initialization channel region, the first initialization thin-film transistor initializes a voltage of the driving gate electrode of the driving thin-film transistor in response to a voltage applied to the first initialization gate electrode.

The first insulating layer may not overlap the compensation channel region of the compensation thin-film transistor.

The first insulating layer may not overlap the first initialization channel region the first initialization thin-film transistor.

The display apparatus may further include a third insulating layer overlapping the driving gate electrode of the driving thin-film transistor; and a storage capacitor including a first electrode and a second electrode that overlap each other, the third insulating layer is disposed between the first electrode and the second electrode.

The driving gate electrode of the driving thin-film transistor and the first electrode of the storage capacitor may be integral with each other.

The first insulating layer may have a thickness in a range of about 1000 Å (angstroms) to about 1500 Å.

The second insulating layer may have a thickness in a range of about 500 Å to about 1000 Å.

The first insulating layer may include silicon oxide, and the second insulating layer may include silicon oxide or silicon nitride.

A method of manufacturing a display apparatus may include forming a first photosensitive pattern and a second photosensitive pattern of different thicknesses on an active layer; forming a driving semiconductor layer and a compensation semiconductor layer using the first photosensitive pattern and the second photosensitive pattern as masks to etch the active layer; exposing an upper surface of the driving semiconductor layer by etching the first photosensitive pattern and forming a third photosensitive pattern by etching at least a portion of the second photosensitive pattern; forming a first insulating layer on the driving semiconductor layer and the third photosensitive pattern; exposing an upper surface of the compensation semiconductor layer by stripping the third photosensitive pattern; and forming a second insulating layer on the first insulating layer and the compensation semiconductor layer.

A thickness of the second photosensitive pattern may be greater than a thickness of the first photosensitive pattern.

The first insulating layer may have a thickness in a range of about 1000 Å (angstroms) to about 1500 Å.

The second insulating layer may have a thickness in a range of about 500 Å to about 1000 Å.

The first insulating layer may include silicon oxide, and the second insulating layer may include silicon oxide or silicon nitride.

The method may further include performing a first cleaning process on the upper surface of the driving semiconductor layer after the exposing of the upper surface of the driving semiconductor layer by etching the first photosensitive pattern.

The method may further include performing a second cleaning process on the upper surface of the compensation semiconductor layer after the exposing of the upper surface of the compensation semiconductor layer by stripping the third photosensitive pattern.

A concentration of HF (hydrofluoric acid) used in the second cleaning process may be lower than a concentration of HF used in the first cleaning process.

The method may further include forming a driving gate electrode and a compensation gate electrode on the second insulating layer after the forming of the second insulating layer on the first insulating layer and the compensation semiconductor layer.

The driving semiconductor layer may include a driving channel region overlapping the driving gate electrode, the compensation semiconductor layer may include a compensation channel region overlapping the compensation gate electrode, and a width of the compensation channel region may be less than a width of the driving channel region.

The compensation semiconductor layer may not overlap the first insulating layer.

Other aspects, features, and advantages of the disclosure will become more apparent from the drawings, the claims, and the detailed description.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
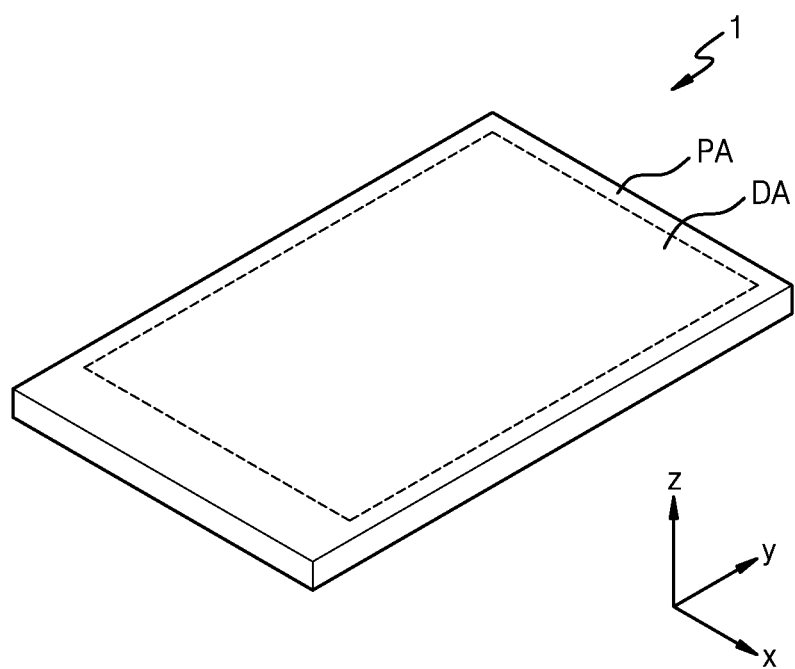
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, embodiments are merely described below, by referring to the figures, to explain aspects of the description.

In the drawings, sizes, thicknesses, ratios, and dimensions of the elements may be exaggerated for ease of description and for clarity. Like numbers refer to like elements throughout.

As used herein, the term "and/or" includes any and all combinations of one or more of the associated listed items. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. The attached drawings for illustrating embodiments of the disclosure are referred to in order to gain a sufficient understanding of the disclosure, the merits thereof, and the objectives accomplished by the implementation of the disclosure. However, the disclosure is not limited to the following embodiments and may be embodied in various forms.

It will be understood that although the terms "first," "second," etc. may be used herein to describe various elements, these elements should not be limited by these terms. These terms are only used to distinguish one element from another. For example, a first element may be referred to as a second element, and similarly, a second element may be referred to as a first element without departing from the scope of the disclosure.

In the following embodiments, the singular forms include the plural forms unless the context clearly indicates otherwise. For example, as used herein, the singular forms, "a," "an," and "the" are intended to include the plural forms as well, unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

It will be further understood that, when a layer, area, or element is referred to as being "on" another layer, area, or element, it may be directly on the other layer, area, or element, or may be indirectly on the other layer, area, or element with intervening layers, areas, or elements therebetween.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Since sizes of elements in the drawings may be exaggerated or reduced for convenience of explanation. For example, because sizes and thicknesses of elements in the drawings are arbitrarily illustrated for convenience of explanation, the disclosure is not limited thereto.

In the following embodiments, the expression "a line extends in a first direction or a second direction" may include a case in which "a line extends in a linear shape" and a case in which "a line extends in a zigzag or curved shape in a first direction or a second direction."

In the following embodiments, when an element is referred to as being "on a plane," it is understood that the element is viewed from the top, and when an element is referred to as being "on a cross-section," it is understood that the element is vertically cut and viewed from the side. In the following embodiments, when elements "overlap" each other, the elements may overlap "on a plane" and "a cross-section."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments will now be described more fully with reference to the accompanying drawings. When describing embodiments with reference to the accompanying drawings, the same or corresponding elements are denoted by the same reference numerals.

FIG. 1 is a schematic perspective view of a display apparatus 1 according to an embodiment.

The display apparatus 1 according to an embodiment may be implemented as an electronic device such as a smartphone, a mobile phone, a navigation device, a game player, a television (TV), a head unit for vehicles, a notebook computer, a laptop computer, a tablet computer, a personal media player (PMP), a personal digital assistant (PDA), or the like within the spirit and the scope of the disclosure. Also, the electronic device may be a flexible device.

As illustrated in FIG. 1, the display apparatus 1 according to an embodiment may include a display area DA and a peripheral area PA. The display apparatus 1 may include a substrate 101 (see FIG. 5), and the shape of the substrate 101 is not limited to a rectangular shape (on an xy plane) as illustrated in FIG. 1, but may have various shapes such as a circle or the like within the spirit and the scope of the disclosure. It is noted that FIG. 1 includes, in addition to the xy plane, a z-axis direction which may be a thickness direction. Also, the substrate 101 may have a bending area and be bent at the bending area. Also, it is to be understood that the shapes described herein may include shapes substantial to the described shapes.

The substrate 101 may include glass or a metal. Also, the substrate 101 may include various flexible or bendable materials, for example, a polymer resin such as polyethersulfone, polyacrylate, polyether imide, polyethylene naphthalate, polyethylene terephthalate, polyphenylene sulfide, polyarylate, polyimide, polycarbonate, or cellulose acetate propionate.

The substrate 101 may have a multi-layered structure including two layers including the aforementioned polymer resin and a barrier layer including an inorganic material between the two layers. The barrier layer may include silicon oxide, silicon nitride, and/or silicon oxynitride.

Display elements may be positioned or disposed in the display area DA. In an embodiment, each display element may be an organic light-emitting diode (OLED) and may emit red, green, blue, or white light. One (sub)pixel positioned or disposed in the display area DA of the display apparatus 1 of FIG. 1 may include the OLED, and may include a thin-film transistor and a capacitor that may control the luminescence level of the OLED.

A driver, a power supply wire, by way of example, may be arranged or disposed in the peripheral area PA. Also, the peripheral area PA may include a pad area to which any of various electronic devices such as a driving integrated circuit or a printed circuit substrate is electrically attached.

Figure 2:
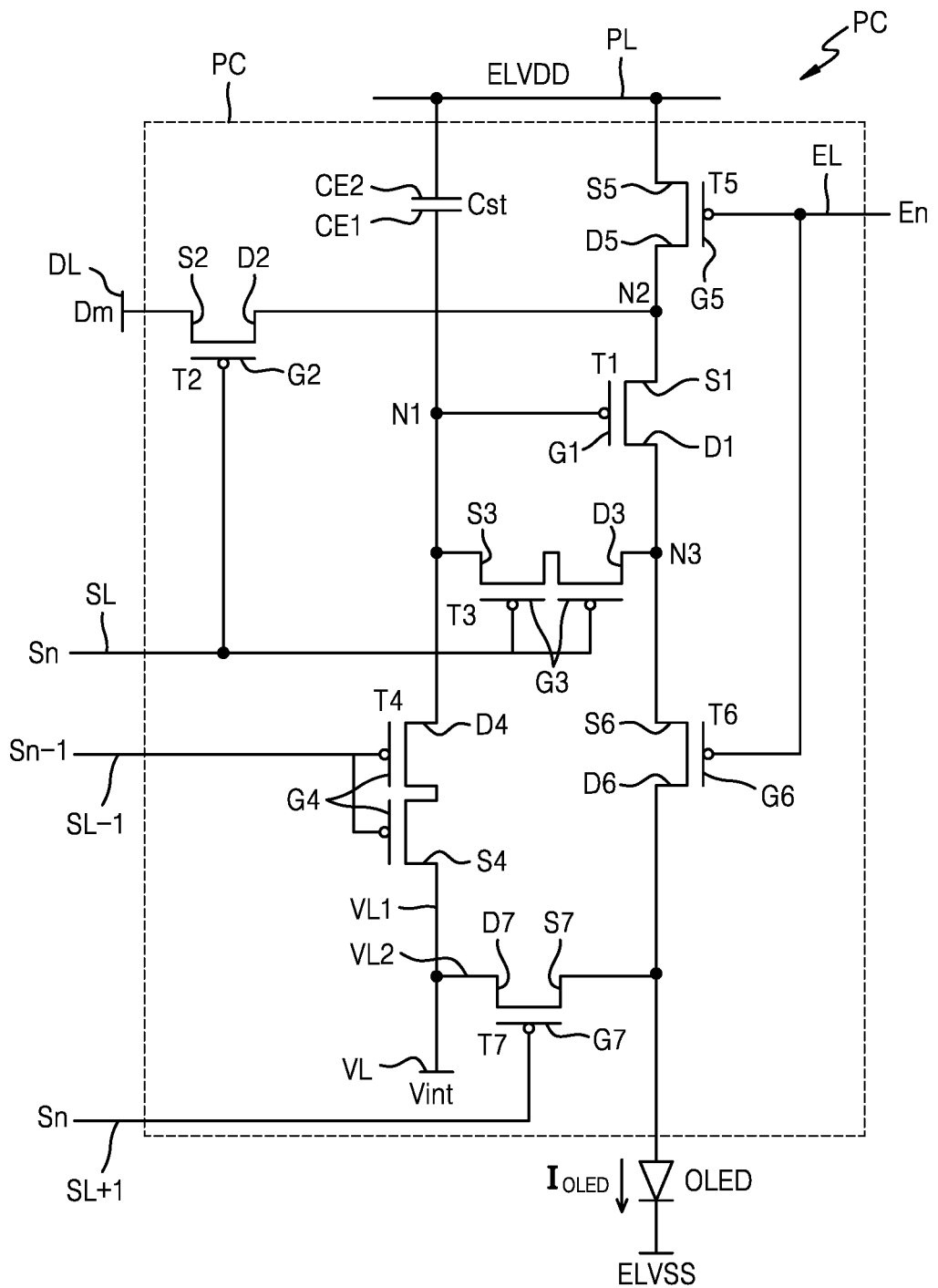
FIG. 2 is a schematic diagram of an equivalent circuit of a (sub)pixel included in the display apparatus of FIG. 1.

FIG. 2 is a schematic diagram of an equivalent circuit of a (sub)pixel included in the display apparatus of FIG. 1. In detail, FIG. 2 is a schematic diagram of an equivalent circuit of a (sub)pixel positioned or disposed in the display area DA of the display apparatus 1. A pixel circuit unit positioned or disposed in one (sub)pixel may include thin-film transistors T1, T2, T3, T4, T5, T6, and T7 and a storage capacitor Cst. The thin-film transistors T1 to T7 and the storage capacitor Cst may be connected to signal lines SL, SL−1, SL+1, EL, and DL, a first initialization voltage line VL1, and a second initialization voltage line VL2 (collectively, an initialization voltage line VL), and a power voltage line PL.

The signal lines SL, SL−1, SL+1, EL, and DL may include a scan line SL to transmit a scan signal Sn, a previous scan line SL−1 to transmit a previous scan signal Sn−1 to a first initialization thin-film transistor T4, a next scan line SL+1 to transmit a scan signal Sn to a second initialization thin-film transistor T7, an emission control line EL to transmit an emission control signal En to an operation control thin-film transistor T5 and an emission control thin-film transistor T6, and a data line DL crossing or intersecting the scan line SL and to transmit a data signal Dm. The power voltage line PL may transmit a driving voltage ELVDD to a driving thin-film transistor T1, the first initialization voltage line VL1 may transmit an initialization voltage Vint to the first initialization thin-film transistor T4, and the second initialization voltage line VL2 may transmit the initialization voltage Vint to the second initialization thin-film transistor T7.

A driving gate electrode G1 of the driving thin-film transistor T1 may be connected to a first electrode CE1 of the storage capacitor Cst, a driving source region S1 of the driving thin-film transistor T1 may be connected to the power voltage line PL via the operation control thin-film transistor T5, and a driving drain region D1 of the driving thin-film transistor T1 is electrically connected to a pixel electrode of an organic light-emitting diode OLED via the emission control thin-film transistor T6. For example, the driving thin-film transistor T1 may control the amount of current flowing from a second node N2 connected to the power voltage line PL to the organic light-emitting diode OLED, in response to a voltage applied to a first node N1, for example, a voltage applied to the driving gate electrode G1. Accordingly, the driving thin-film transistor T1 may receive the data signal Dm in response to a switching operation of a switching thin-film transistor T2 and supply a driving current $I_{OLED}$ to the organic light-emitting diode OLED. The operation control thin-film transistor T5 may be between the second node N2 and the power voltage line PL.

A switching gate electrode G2 of the switching thin-film transistor T2 may be connected to the scan line SL, a switching source region S2 of the switching thin-film transistor T2 may be connected to the data line DL, and a switching drain region D2 of the switching thin-film transistor T2 may be connected to the second node N2, connected to the driving source region S1 of the driving thin-film transistor T1, and connected to the power voltage line PL via the operation control thin-film transistor T5. The switching thin-film transistor T2 may be turned on in response to the scan signal Sn received through the scan line SL and may perform a switching operation of transmitting the data signal Dm, transmitted from the data line DL, to the driving source region S1 of the driving thin-film transistor T1.

A compensation thin-film transistor T3 may be connected between the first node N1 and a third node N3 between the driving thin-film transistor T1 and the organic light-emitting diode OLED, and may diode-connect the driving thin-film transistor T1 in response to a voltage applied to a compensation gate electrode G3. For example, the compensation gate electrode G3 of the compensation thin-film transistor T3 may be connected to the scan line SL, a compensation drain region D3 of the compensation thin-film transistor T3 may be connected to the driving drain region D1 of the driving thin-film transistor T1 and may be connected to a pixel electrode of the organic light-emitting diode OLED via the emission control thin-film transistor T6, and a compensation source region S3 of the compensation thin-film transistor T3 may be connected to the first electrode CE1 of the storage capacitor Cst, a first initialization drain region D4 of the first initialization thin-film transistor T4, and the driving gate electrode G1 of the driving thin-film transistor T1.

The compensation thin-film transistor T3 may be turned on in response to the scan signal Sn received through the scan line SL and may diode-connect the driving thin-film transistor T1 by electrically connecting the driving gate electrode G1 and the driving drain region D1 of the driving thin-film transistor T1.

Though it is illustrated in FIG. 2 that the compensation thin-film transistor T3 may include two gate electrodes, one or more embodiments are not limited thereto. The compensation thin-film transistor T3 may include one gate electrode.

The first initialization thin-film transistor T4 may be connected between the first node N1 and the first initialization voltage line VL1, and may initialize a voltage of the driving gate electrode G1 in response to a voltage applied to a first initialization gate electrode G4. For example, the first initialization gate electrode G4 of the first initialization thin-film transistor T4 may be connected to the previous scan line SL−1, a first initialization source region S4 of the first initialization thin-film transistor T4 may be connected to the first initialization voltage line VL1, and the first initialization drain region D4 of the first initialization thin-film transistor T4 may be connected to the first electrode CE1 of the storage capacitor Cst, the compensation source region S3 of the compensation thin-film transistor T3, and the driving gate electrode G1 of the driving thin-film transistor T1. The first initialization thin-film transistor T4 may be turned on in response to the previous scan signal Sn−1 received through the previous scan line SL−1 and may perform an initialization operation of initializing a voltage of the driving gate electrode G1 of the driving thin-film transistor T1 by transmitting the initialization voltage Vint to the driving gate electrode G1 of the driving thin-film transistor T1.

Though it is illustrated in FIG. 2 that the first initialization thin-film transistor T4 may include two gate electrodes, one or more embodiments are not limited thereto. The first initialization thin-film transistor T4 may include one gate electrode.

The operation control thin-film transistor T5 may be connected between the second node N2 and the power voltage line PL, and may be turned on in response to a voltage applied to an operation control gate electrode G5. For example, the operation control gate electrode G5 of the operation control thin-film transistor T5 may be connected to the emission control line EL, an operation control source region S5 of the operation control thin-film transistor T5 may be connected to the power voltage line PL, and an operation control drain region D5 of the operation control thin-film transistor T5 may be connected to the driving source region S1 of the driving thin-film transistor T1 and the switching drain region D2 of the switching thin-film transistor T2.

The emission control thin-film transistor T6 may be connected between the third node N3 and the organic light-emitting diode OLED, and may be turned on in response to a voltage applied to an emission control gate electrode G6 from the emission control line EL. For example, the emission control gate electrode G6 of the emission control thin-film transistor T6 may be connected to the emission control line EL, an emission control source region S6 of the emission control thin-film transistor T6 may be connected to the driving drain region D1 of the driving thin-film transistor T1 and the compensation drain region D3 of the compensation thin-film transistor T3, and an emission control drain region D6 of the emission control thin-film transistor T6 is electrically connected to a second initialization source region S7 of the second initialization thin-film transistor T7 and the pixel electrode of the organic light-emitting diode OLED.

The operation control thin-film transistor T5 and the emission control thin-film transistor T6 may be simultaneously turned on in response to the emission control signal En received through the emission control line EL and may cause the driving voltage ELVDD to be transmitted to the organic light-emitting diode OLED, so that the driving current $I_{OLED}$ flows through the organic light-emitting diode OLED.

A second initialization gate electrode G7 of the second initialization thin-film transistor T7 may be connected to the next scan line SL+1, a second initialization source region S7 of the second initialization thin-film transistor T7 may be connected to the emission control drain region D6 of the emission control thin-film transistor T6 and the pixel electrode of the organic light-emitting diode OLED, and a second initialization drain region D7 of the second initialization thin-film transistor T7 may be connected to the second initialization voltage line VL2.

Moreover, because the scan line SL and the next scan line SL+1 are electrically connected to each other, the same scan signal Sn may be applied to the scan line SL and the next scan line SL+1. Accordingly, the second initialization thin-film transistor T7 may be turned on in response to the scan signal Sn received through the next scan line SL+1 and may perform an operation of initializing the pixel electrode of the organic light-emitting diode OLED. In case that needed, the second initialization thin-film transistor T7 may be omitted.

A second electrode CE2 of the storage capacitor Cst may be connected to the power voltage line PL, and a common electrode (for example, a cathode) of the organic light-emitting diode OLED may be connected to a common voltage line ELVSS. Therefore, the organic light-emitting diode OLED may emit light by receiving the driving current $I_{OLED}$ from the driving thin-film transistor T1, so that an image may be displayed.

Figure 3:
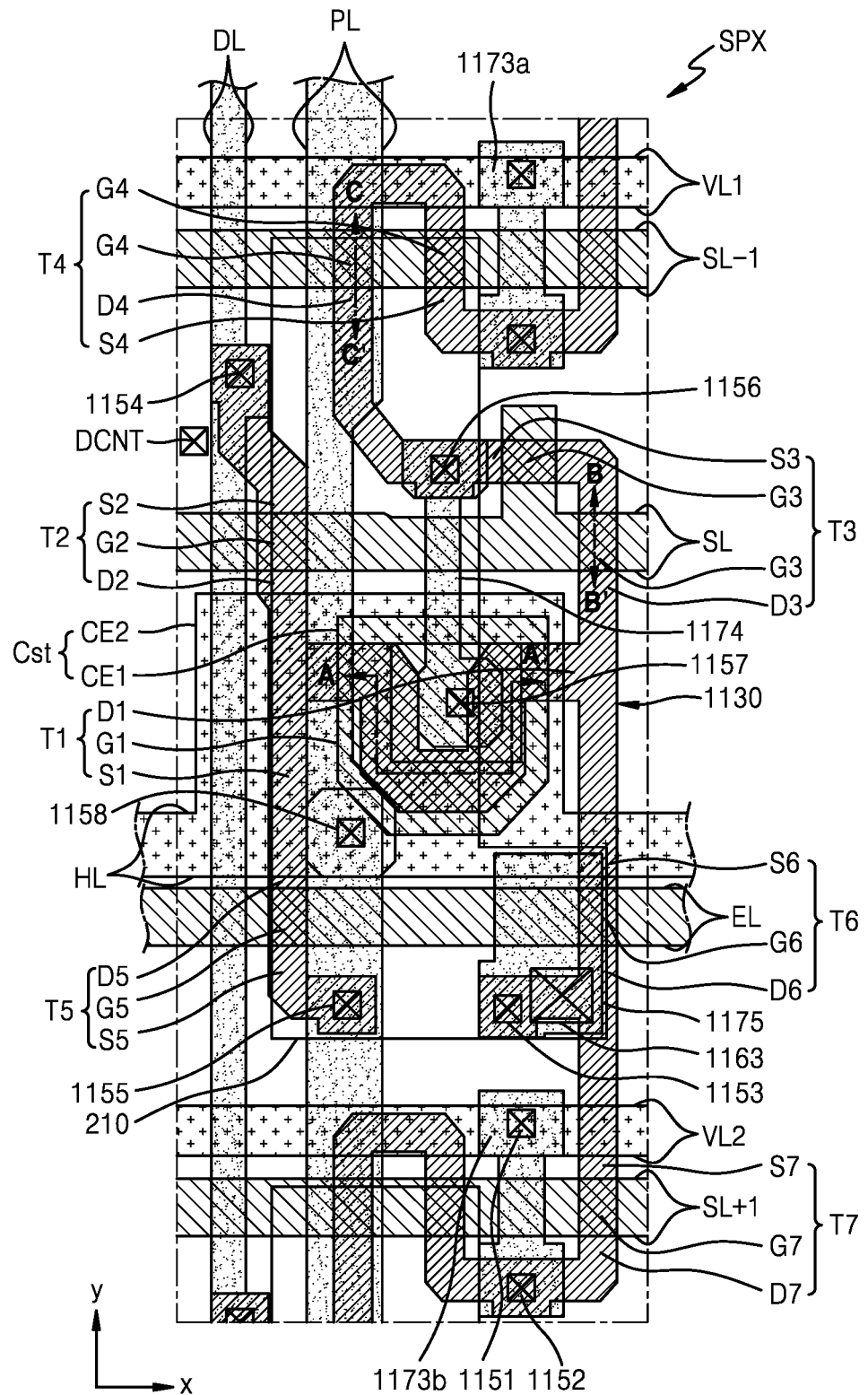
FIG. 3 is a schematic layout diagram of positions of thin-film transistors and a capacitor in the (sub)pixel of FIG. 2.
Figure 4:
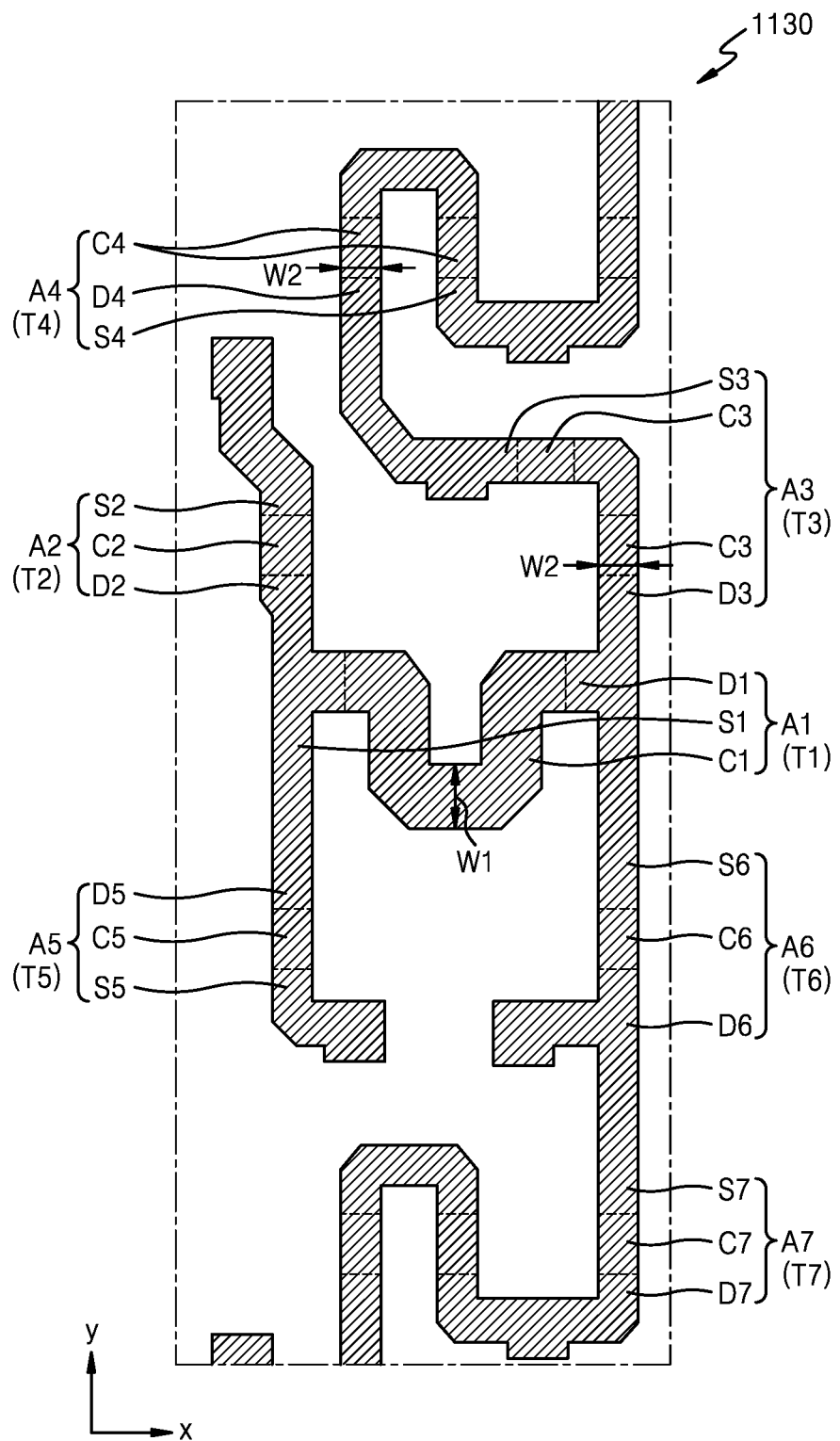
FIG. 4 is a schematic layout diagram of a semiconductor layer that is a part of the display apparatus of FIG. 3.
Figure 5:
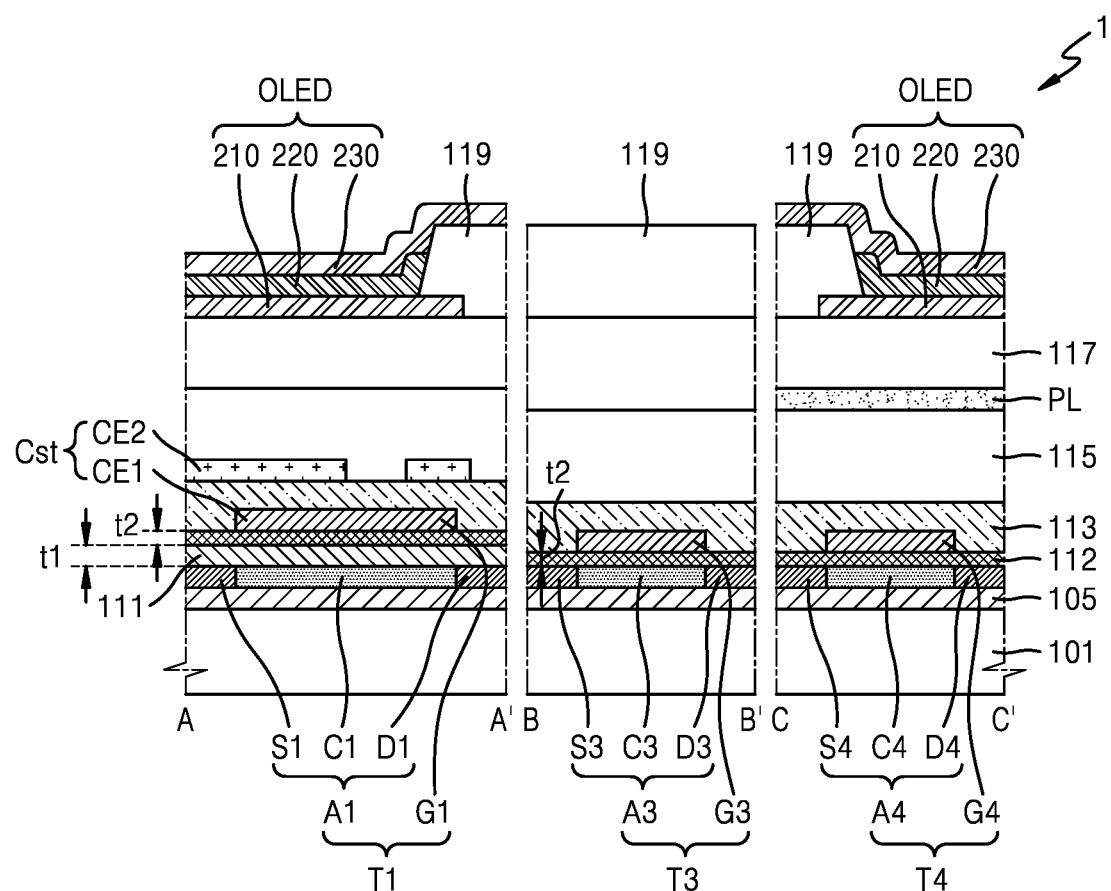
FIG. 5 is a schematic cross-sectional view of the display apparatus taken along lines A-A', B-B', and C-C', as a part of FIG. 3.

FIG. 3 is a schematic layout diagram of positions of thin-film transistors and a capacitor in the (sub)pixel of FIG. 2, FIG. 4 is a schematic layout diagram of a semiconductor layer 1130 that is a part of the display apparatus of FIG. 3, and FIG. 5 is a schematic cross-sectional view of the display apparatus 1 taken along lines A-A', B-B', and C-C', as a part of FIG. 3. In the cross-sectional view, the sizes of the elements are exaggerated and/or reduced, for convenience.

Referring to FIG. 4, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be arranged or disposed along the semiconductor layer 1130. Some or a number of portions of the semiconductor layer 1130 may constitute semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. For example, some or a number of portions of the semiconductor layer 1130 may constitute channel regions, source regions, or drain regions of thin-film transistors.

In an embodiment, the driving thin-film transistor T1 may include a driving semiconductor layer A1, and the driving semiconductor layer A1 may include a driving channel region C1, a driving source region S1, and a driving drain region D1. For example, a portion of the driving semiconductor layer A1 overlapping the driving gate electrode G1 (see FIG. 3) may be the driving channel region C1.

In an embodiment, the switching thin-film transistor T2 may include a switching semiconductor layer A2, and the switching semiconductor layer A2 may include a switching channel region C2, a switching source region S2, and a switching drain region D2. For example, a portion of the switching semiconductor layer A2 overlapping the switching gate electrode G2 (see FIG. 2) may be the switching channel region C2.

In an embodiment, the compensation thin-film transistor T3 may include a compensation semiconductor layer A3, and the compensation semiconductor layer A3 may include a compensation channel region C3, a compensation source region S3, and a compensation drain region D3. For example, a portion of the compensation semiconductor layer A3 overlapping the compensation gate electrode G3 (see FIG. 2) may be the compensation channel region C3.

In an embodiment, the first initialization thin-film transistor T4 may include a first initialization semiconductor layer A4, and the first initialization semiconductor layer A4 may include a first initialization channel region C4, a first initialization source region S4, and a first initialization drain region D4. For example, a portion of the first initialization semiconductor layer A4 overlapping the first initialization gate electrode G4 (see FIG. 2) may be the first initialization channel region C4.

In an embodiment, the operation control thin-film transistor T5 may include an operation control semiconductor layer A5, and the operation control semiconductor layer A5 may include an operation control channel region C5, an operation control source region S5, and an operation control drain region D5. For example, a portion of the operation control semiconductor layer A5 overlapping the operation control gate electrode G5 (see FIG. 2) may be the operation control channel region C5.

In an embodiment, the emission control thin-film transistor T6 may include an emission control semiconductor layer A6, and the emission control semiconductor layer A6 may include an emission control channel region C6, an emission control source region S6, and an emission control drain region D6. For example, a portion of the emission control semiconductor layer A6 overlapping the emission control gate electrode G6 (see FIG. 2) may be the emission control channel region C6.

In an embodiment, the second initialization thin-film transistor T7 may include a second initialization semiconductor layer A7, and the second initialization semiconductor layer A7 may include a second initialization channel region C7, a second initialization source region S7, and a second initialization drain region D7. For example, a portion of the second initialization semiconductor layer A7 overlapping the second initialization gate electrode G7 (see FIG. 2) may be the second initialization channel region C7.

As illustrated in FIG. 4, each of the compensation thin-film transistor T3 and the first initialization thin-film transistor T4 may include two gate electrodes, but one or more embodiments are not limited thereto. Each of the compensation thin-film transistor T3 and the first initialization thin-film transistor T4 may include one gate electrode.

The semiconductor layer 1130 may be formed on the substrate 101. A buffer layer 105 may be formed on the substrate 101, and the semiconductor layer 1130 may be formed on the buffer layer 105.

The buffer layer 105 may reduce or block penetration of foreign materials, moisture, or external air from the bottom of the substrate 101 and may provide a flat surface on the substrate 101. The buffer layer 105 may include an inorganic material such as an oxide or nitride, an organic material, or an organic-inorganic composite, and may have a single-layered structure or multi-layered structure of inorganic materials and organic materials. In an embodiment, the buffer layer 105 may have a structure in which a first buffer layer and a second buffer layer may be stacked each other, and the first buffer layer and the second buffer layer may include different materials. For example, the first buffer layer may include silicon nitride, and the second buffer layer may include silicon oxide.

As described above, in case that the first buffer layer may include silicon nitride, hydrogen may be included while silicon nitride is formed. Accordingly, the carrier mobility of the semiconductor layer 1130 formed on the buffer layer 105 may be improved, and thus, electrical characteristics of a thin-film transistor may be improved. Also, the semiconductor layer 1130 may include a silicon material, and, interfacial adhesion properties between the semiconductor layer 1130 including silicon and the second buffer layer including silicon oxide may be improved, and thus, electrical characteristics of the thin-film transistor may be improved.

The semiconductor layer 1130 may include low-temperature polysilicon (LTPS). Because a polysilicon material has a high electron mobility (about 100 cm$^2$/Vs or greater), energy consumption power is low and reliability is high. By way of example, the semiconductor layer 1130 may include amorphous silicon (a-Si) and/or an oxide semiconductor. By way of example, some or a number of thin-film transistors may include LTPS, and others may include a-Si and/or an oxide semiconductor.

Source regions and drain regions of the semiconductor layer 1130 may be doped with impurities, and the impurities may include N-type impurities or P-type impurities. Each source region and each drain region may respectively correspond to a source electrode and a drain electrode. The source region and the drain region may be changed with each other according to characteristics of the thin-film transistor. Hereinafter, the terms "source region" and "drain region" are used instead of the "source electrode" or the "drain electrode." In the equivalent circuit diagram of FIG. 2, it is illustrated that portions of the semiconductor layer 1130 are doped with P-type impurities, and thin-film transistors are implemented as p-channel metal-oxide-semiconductor field-effect transistors (MOSFETs) (PMOSs). Other portions of the semiconductor layer 1130 may also be doped with impurities, and may function as wires for electrically connecting the thin-film transistors and/or the capacitor.

A first insulating layer 111 and/or a second insulating layer 112 may be positioned or disposed on the semiconductor layer 1130, and the driving gate electrode G1, the scan line SL, the previous scan line SL−1, the next scan line SL+1, and the emission control line EL may be positioned or disposed on the first insulating layer 111 and/or the second insulating layer 112. Detailed structures of the first insulating layer 111 and the second insulating layer 112 are described below.

Portions of the scan line SL overlapping the switching and compensation channel regions C2 and C3 of the switching and compensation thin-film transistors T2 and T3 may be the switching gate electrode G2 and the compensation gate electrode G3, respectively, a portion of the previous scan line SL−1 overlapping the first initialization channel region C4 of the first initialization thin-film transistor T4 may be the first initialization gate electrode G4, a portion of the next scan line SL+1 overlapping the second initialization channel region C7 of the second initialization thin-film transistor T7 may be the second initialization gate electrode G7, and a portion of the emission control line EL overlapping the operation control and emission control channel regions C5 and C6 of the operation control and emission control thin-film transistors T5 and T6 may be the operation control gate electrode G5 and the emission control gate electrode G6, respectively.

Each of the driving gate electrode G1, the scan line SL, the previous scan line SL−1, the next scan line SL+1, and the emission control line EL may include a conductive material including molybdenum (Mo), aluminum (Al), copper (Cu), or titanium (Ti), and may have a single-layered structure or multi-layered structure including the aforementioned material. In an embodiment, the driving gate electrode G1, the scan line SL, the previous scan line SL−1, the next scan line SL+1, and the emission control line EL may have a multi-layered structure of Mo/Al or a multi-layered structure of Mo/Al/Mo.

A third insulating layer 113 may be provided on the driving gate electrode G1, the scan line SL, the previous scan line SL−1, the next scan line SL+1, and the emission control line EL. The third insulating layer 113 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An electrode voltage line HL, the first initialization voltage line VL1, and the second initialization voltage line VL2 may be arranged or disposed on the third insulating layer 113. The electrode voltage line HL may cover or overlap at least a part of the driving gate electrode G1, and may form the storage capacitor Cst along with the driving gate electrode G1.

The first electrode CE1 of the storage capacitor Cst may be formed as a single body with the driving gate electrode G1 of the driving thin-film transistor T1 or may be integral with each other. For example, the driving gate electrode G1 of the driving thin-film transistor T1 may function as the first electrode CE1 of the storage capacitor Cst. A portion of the electrode voltage line HL overlapping the driving gate electrode G1 may be the second electrode CE2 of the storage capacitor Cst. Accordingly, the third insulating layer 113 may function as a dielectric layer of the storage capacitor Cst.

Each of the electrode voltage line HL, the first initialization voltage line VL1, and the second initialization voltage line VL2 may include a conductive material including Mo, Al, Cu, or Ti and may have a single-layered or multi-layered structure including the aforementioned material. In an embodiment, the electrode voltage line HL, the first initialization voltage line VL1, and the second initialization voltage line VL2 may have a multi-layered structure of Mo/Al or a multi-layered structure of Mo/Al/Mo.

An interlayer insulating layer 115 may be positioned or disposed on the electrode voltage line HL, the first initialization voltage line VL1, and the second initialization voltage line VL2. The interlayer insulating layer 115 may include $SiO_2$, $SiN_X$, SiON, $Al_2O_3$, $TiO_2$, $Ta_2O_5$, $HfO_2$, or ZnO.

The data line DL, the power voltage line PL, first and second initialization connection lines 1173a and 1173b, a node connection line 1174, and a connection metal 1175 may be arranged or disposed on the interlayer insulating layer 115. The data line DL, the power voltage line PL, the node connection line 1174, and the connection metal 1175 may include a conductive material including Mo, Al, Cu, or Ti and may have a single-layered structure or a multi-layered structure including the aforementioned material. In an embodiment, the data line DL, the power voltage line PL, the node connection line 1174, and the connection metal 1175 may have a multi-layered structure of Ti/Al/Ti.

The data line DL may be connected to the switching source region S2 of the switching thin-film transistor T2 through a contact hole 1154. In case that necessary, a portion of the data line DL may be understood as a switching source electrode.

The power voltage line PL may be connected to the second electrode CE2 of the storage capacitor Cst through a contact hole 1158 formed in the interlayer insulating layer 115. Accordingly, the electrode voltage line HL and the power voltage line PL may have the same voltage level (a constant voltage). Also, the power voltage line PL may be connected to the operation control drain region D5 through a contact hole 1155.

The first initialization voltage line VL1 may be connected to the first initialization thin-film transistor T4 through a first initialization connection line 1173a, and the second initialization voltage line VL2 may be connected to the second initialization thin-film transistor T7 through a second initialization connection line 1173b. Moreover, the first initialization voltage line VL1 and the second initialization voltage line VL2 may have the same constant voltage (for example, −2 V).

One end or an end of the node connection line 1174 may be connected to the compensation source region S3 through a contact hole 1156, and the other end or another end of the node connection line 1174 may be connected to the driving gate electrode G1 through a contact hole 1157.

The connection metal 1175 may be connected to the emission control semiconductor layer A6 of the emission control thin-film transistor T6 through a contact hole 1153. The connection metal 1175 may be connected to a pixel electrode 210 of the organic light-emitting diode OLED through a contact hole 1163. Accordingly, the emission control thin-film transistor T6 may be electrically connected to the pixel electrode 210 of the organic light-emitting diode OLED. FIG. 3 also includes contact holes 1151 and 1152.

A planarization layer 117 may be positioned or disposed on the data line DL, the power voltage line PL, the first and second initialization connection lines 1173a and 1173b, the node connection line 1174, and the connection metal 1175, and the organic light-emitting diode OLED may be positioned or disposed on the planarization layer 117.

Moreover, though one pixel circuit PC is illustrated in FIG. 2 and the structure of one (sub)pixel SPX is described with reference to FIG. 3, subpixels SPX having the same pixel circuit PC may be arranged or disposed in a first direction (an x-axis direction) and a second direction (a y-axis direction). The first initialization voltage line VL1, the previous scan line SL−1, the second initialization voltage line VL2, and the next scan line SL+1 may be shared by two pixel circuits PC adjacent to each other in the second direction (the y-axis direction).

For example, the first initialization voltage line VL1 and the previous scan line SL−1 may be electrically connected to the second initialization thin-film transistor T7 in another pixel circuit PC arranged or disposed above the pixel circuit PC (in a +y direction) illustrated in FIG. 3 in the second direction (the y-axis direction) of the drawing. Accordingly, a previous scan signal applied to the previous scan line SL−1 may be transmitted as a next scan signal to a second initialization thin-film transistor T7 of the other pixel circuit PC. Likewise, the second initialization voltage line VL2 and the next scan line SL+1 may be electrically connected to the first initialization thin-film transistor T4 in another pixel circuit PC arranged or disposed under or below the pixel circuit PC (in a −y direction) illustrated in FIG. 3 in the second direction (the y-axis direction) of the drawing to transmit a previous scan signal and an initialization voltage to the first initialization thin-film transistor T4.

Referring to FIGS. 3 to 5 again, the planarization layer 117 may have a flat top surface so that the pixel electrode 210 is formed flat. The planarization layer 117 may include an organic material, and may have a single-layered or multi-layered structure. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acrylic polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may also include an inorganic material. The planarization layer 117 may include $SiO_2$, $SiN_x$, SiON, $Al_2O_3$, $TiO_2$, $Ta_2O_5$, $HfO_2$, or ZnO. In case that the planarization layer 117 may include an inorganic material, chemical mechanical polishing may be performed in case that necessary. Moreover, the planarization layer 117 may include both an organic material and an inorganic material.

The organic light-emitting diode OLED may include the pixel electrode 210, a common electrode 230, and an intermediate layer 220 between the pixel electrode 210 and the common electrode 230 and including an emission layer.

The pixel electrode 210 may be connected to the connection metal 1175 through the contact hole 1163, and the connection metal 1175 may be connected to an emission control drain region through the contact hole 1153. The pixel electrode 210 may include a (semi-)transmissive electrode or a reflective electrode. In an embodiment, the pixel electrode 210 may include a reflective layer including silver (Ag), magnesium (Mg), Al, platinum (Pt), palladium (Pd), gold (Au), nickel (Ni), neodymium (Nd), iridium (Ir), chromium (Cr), or a compound thereof, and a transparent or semi-transparent electrode layer on the reflective layer. The transparent or semi-transparent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the pixel electrode 210 may have a stacked structure including ITO/Ag/ITO.

A pixel-defining layer 119 may be arranged or disposed on the planarization layer 117 and may have an opening portion through which a central portion of the pixel electrode 210 is exposed to define an emission area of a pixel. Also, the pixel-defining layer 119 may increase a distance between an edge of the pixel electrode 210 and the common electrode 230 arranged or disposed over the pixel electrode 210, to prevent an arc or the like from occurring on the edge of the pixel electrode 210. The pixel-defining layer 119 may be formed of an organic insulating material such as polyimide, polyamide, an acrylic resin, benzocyclobutene, HMDSO, or a phenolic resin by using spin coating or the like within the spirit and the scope of the disclosure.

The pixel-defining layer 119 may include an organic insulating material. By way of example, the pixel-defining layer 119 may include an inorganic insulating material such as silicon nitride, silicon oxynitride, or silicon oxide. By way of example, the pixel-defining layer 119 may include an organic insulating material and an inorganic insulating material. In an embodiment, the pixel-defining layer 119 may include a light blocking material, and may be provided in black. The light blocking material may include a resin or paste including carbon black, carbon nanotube, or black dye, metal particles, for example, nickel, aluminum, molybdenum, or any alloy thereof, metal oxide particles (for example, chromium oxide), or metal nitride particles (for example, chromium nitride). In case that the pixel-defining layer 119 may include a light blocking material, reflection of external light by metal structures arranged or disposed under or below the pixel-defining layer 119 may be reduced.

The intermediate layer 220 may include an emission layer. The emission layer may include an organic material including a fluorescent or phosphorescent material emitting red light, green light, blue light, or white light. The emission layer may include a low-molecular weight organic material or a polymer organic material, and functional layers such as a hole transport layer (HTL), a hole injection layer (HIL), an electron transport layer (ETL), and an electron injection layer (EIL) may be selectively arranged or disposed under or below and over the emission layer. The intermediate layer 220 may be arranged or disposed to correspond to each of pixel electrodes 210. However, one or more embodiments are not limited thereto, and a layer such as an HTL, an HIL, an ETL, or an EIL from among layers included in the intermediate layer 220 may be formed as a single body over the pixel electrodes 210.

The common electrode 230 may include a transparent electrode or a reflective electrode. In an embodiment, the common electrode 230 may be a transparent or semi-transparent electrode and may include a metal thin film having a low work function including lithium (Li), calcium (Ca), LiF/Ca, LiF/Al, Al, Ag, Mg, or a compound thereof. The common electrode 230 may further include a transparent conductive oxide (TCO) film, such as ITO, IZO, ZnO, $In_2O_3$, or the like, in addition to the metal thin film. The common electrode 230 may be formed as a single body to correspond to the pixel electrodes 210.

An encapsulation layer including a first inorganic layer, a second inorganic layer, and an organic layer therebetween may be positioned or disposed on the common electrode 230.

The first inorganic layer and the second inorganic layer may each include $SiO_2$, $SiN_x$, SiON, $Al_2O_3$, $TiO_2$, $Ta_2O_5$, $HfO_2$, or ZnO. The organic layer may include polyethylene terephthalate, polyethylene naphthalate, polycarbonate, polyimide, polyethylene sulfonate, polyoxymethylene, polyarylate, HMDSO, acrylic resin (for example, polymethyl methacrylate, polyacrylic acid, and the like), or any combination thereof.

As described above, the first insulating layer 111 and/or the second insulating layer 112 may be positioned or disposed on the semiconductor layer 1130, and the driving gate electrode G1, the scan line SL, the previous scan line SL−1, the next scan line SL+1, and the emission control line EL may be positioned or disposed on the first insulating layer 111 and/or the second insulating layer 112. The scan line SL, the previous scan line SL−1, the next scan line SL+1, and the emission control line EL may include the switching gate electrode G2, the compensation gate electrode G3, the first initialization gate electrode G4, the operation control gate electrode G5, the emission control gate electrode G6, and the second initialization gate electrode G7 as described above. Accordingly, the first insulating layer 111 and/or the second insulating layer 112 may be between the semiconductor layer 1130 and the driving gate electrode G1, the switching gate electrode G2, the compensation gate electrode G3, the first initialization gate electrode G4, the operation control gate electrode G5, the emission control gate electrode G6, and the second initialization gate electrode G7.

In the display apparatus 1 according to an embodiment, the first insulating layer 111 and the second insulating layer 112 may be between the driving channel region C1 and the driving gate electrode G1 of the driving semiconductor layer A1, the second insulating layer 112 may be between the compensation channel region C3 and the compensation gate electrode G3 of the compensation semiconductor layer A3, and the second insulating layer 112 may be between the first initialization channel region C4 and the first initialization gate electrode G4 of the first initialization semiconductor layer A4. For example, the layered structure between the driving channel region C1 and the driving gate electrode G1 of the driving semiconductor layer A1 may be different from the layered structure between the compensation channel region C3 and the compensation gate electrode G3 of the compensation semiconductor layer A3, and the layered structure between the driving channel region C1 and the driving gate electrode G1 of the driving semiconductor layer A1 may be different from the layered structure between the first initialization channel region C4 and the first initialization gate electrode G4 of the first initialization semiconductor layer A4.

In case that a leakage current increases in the compensation thin-film transistor T3 and the first initialization thin-film transistor T4, a change in current may be induced in the driving thin-film transistor T1 to cause a change in luminance of an organic light-emitting diode. For example, due to a leakage current in the compensation thin-film transistor T3 and the first initialization thin-film transistor T4, a flicker phenomenon may occur or a display apparatus may not display high-quality images. The flicker phenomenon may mean that images displayed on a screen flicker. Also, in case that a leakage current increases in the compensation thin-film transistor T3, a luminance defect may occur during high-speed operation.

A subthreshold current $I_{off}$ refers to a current that flows even in case that a voltage corresponding to a threshold voltage or less is applied to a gate. For example, due to the subthreshold current $I_{off}$, a thin-film transistor may operate even in a state in which the thin-film transistor is turned off, which causes unintended power consumption.

The subthreshold current $I_{off}$ may be affected by a capacitance between a channel region (or a semiconductor layer) and a gate electrode. In case that the capacitance between the channel region (or the semiconductor layer) and the gate electrode is increased, the subthreshold current $I_{off}$ may be reduced. Accordingly, a thickness of an insulating layer between the compensation channel region C3 and the compensation gate electrode G3 of the compensation thin-film transistor T3 is reduced, a capacitance between the compensation channel region C3 and the compensation gate electrode G3 is increased, and thus, a subthreshold current of the compensation thin-film transistor T3 may be reduced. Also, in case that a thickness of an insulating layer between the first initialization channel region C4 and the first initialization gate electrode G4 of the first initialization thin-film transistor T4 is reduced, a capacitance between the first initialization channel region C4 and the first initialization gate electrode G4 is increased, and thus, a subthreshold current of the first initialization thin-film transistor T4 may be reduced.

In contrast, in case that a thickness between the driving channel region C1 and the driving gate electrode G1 is reduced, a driving range of a gate voltage applied to the driving gate electrode G1 of the driving thin-film transistor T1 is narrowed. Accordingly, it may be difficult to control a gate voltage Vgs of the driving thin-film transistor T1 to have a rich gradation.

For example, in case that a thickness of insulating layer between a channel region of a semiconductor and a gate electrode is reduced, characteristics of the compensation thin-film transistor T3 and the first initialization thin-film transistor T4 may be improved, but characteristics of the driving thin-film transistor T1 may deteriorate. In case that the thickness of insulating layer between the semiconductor layer and the gate electrode is reduced, subthreshold currents of the compensation thin-film transistor T3 and the first initialization thin-film transistor T4 are reduced, but a driving range of the driving thin-film transistor T1 is narrowed.

However, in the case of the display apparatus according to one or more embodiments, the layered structure between the driving channel region C1 and the driving gate electrode G1 of the driving thin-film transistor T1 may be different from the layered structure between the compensation channel region C3 and the compensation gate electrode G3 of the compensation thin-film transistor T3. Also, the layered structure between the driving channel region C1 and the driving gate electrode G1 of the driving thin-film transistor T1 may be different from the layered structure between the first initialization channel region C4 and the first initialization gate electrode G4 of the first initialization thin-film transistor T4. Therefore, by extending the driving range of the driving thin-film transistor T1, a rich gradation may be expressed, subthreshold currents $I_{off}$ of the compensation thin-film transistor T3 and the first initialization thin-film transistor T4 may be reduced, on currents $I_{on}$ of the compensation thin-film transistor T3 and the first initialization thin-film transistor T4 may be increased, and sensitivity of the compensation thin-film transistor T3 and the first initialization thin-film transistor T4 may be increased.

In detail, the first insulating layer 111 and the second insulating layer 112 may be between the driving channel region C1 and the driving gate electrode G1 of the driving thin-film transistor T1. For example, a multi-layered structure may be applied between the driving channel region C1 and the driving gate electrode G1 of the driving thin-film transistor T1.

The second insulating layer 112 may be between the compensation channel region C3 and the compensation gate electrode G3 of the compensation thin-film transistor T3. Only the second insulating layer 112 is between the compensation channel region C3 and the compensation gate electrode G3 of the compensation thin-film transistor T3, so that a single-layered structure may be applied between the compensation channel region C3 and the compensation gate electrode G3 of the compensation thin-film transistor T3. For example, the compensation channel region C3 of the compensation thin-film transistor T3 may not overlap the first insulating layer 111.

Also, the second insulating layer 112 may be between the first initialization channel region C4 and the first initialization gate electrode G4 of the first initialization thin-film transistor T4. Only the second insulating layer 112 is between the first initialization channel region C4 and the first initialization gate electrode G4 of the first initialization thin-film transistor T4, so that a single-layered structure may be applied between the first initialization channel region C4 and the first initialization gate electrode G4 of the first initialization thin-film transistor T4. For example, the first initialization channel region C4 of the first initialization thin-film transistor T4 may not overlap the first insulating layer 111.

In an embodiment, the first insulating layer 111 may have a first thickness t1 in a direction perpendicular or substantially perpendicular to the substrate 101. The first thickness t1 may be in a range of about 1000 angstroms (Å) to about 1500 Å. In case that a thickness of the first insulating layer 111 (for example, the first thickness t1) is less than about 1000 Å, a total thickness of an insulating layer between the driving channel region C1 and the driving gate electrode G1 of the driving thin-film transistor T1 is small, and thus, the driving range of the driving thin-film transistor T1 may be narrowed. In contrast, the thickness of the first insulating layer 111 (for example, the first thickness t1) is greater than about 1500 Å, the total thickness of the insulating layer between the driving channel region C1 and the driving gate electrode G1 of the driving thin-film transistor T1 is too large, and thus, it may be difficult to control the driving gate electrode G1.

Accordingly, in case that the thickness of the first insulating layer 111 (for example, the first thickness t1) is provided in a range of about 1000 Å to about 1500 Å, the driving thin-film transistor T1 may have an extensive driving range.

In an embodiment, the second insulating layer 112 may have a second thickness t2 in a direction perpendicular to the substrate 101. The second thickness t2 may be in a range of about 500 Å to about 1000 Å. In case that a thickness of the second insulating layer 112 (for example, the second thickness t2) is less than about 500 Å, a gap between the compensation channel region C3 and the compensation gate electrode G3 of the compensation thin-film transistor T3 and a gap between the first initialization channel region C4 and the first initialization gate electrode G4 of the first initialization thin-film transistor T4 are too close, and thus, subthreshold currents may be increased. In contrast, in case that the thickness of the second insulating layer 112 (for example, the second thickness t2) is greater than about 1000 Å, the gap between the compensation channel region C3 and the compensation gate electrode G3 of the compensation thin-film transistor T3 and the gap between the first initialization channel region C4 and the first initialization gate electrode G4 of the first initialization thin-film transistor T4 are too far, and thus, the subthreshold currents may be increased.

Accordingly, in case that the thickness of the second insulating layer 112 (for example, the second thickness t2) is provided in a range of about 500 Å to about 1000 Å, the subthreshold currents of the compensation thin-film transistor T3 and the first initialization thin-film transistor T4 may be reduced.

The total thickness of the insulating layer between the driving channel region C1 and the driving gate electrode G1 of the driving thin-film transistor T1 is provided in a range of about 1500 Å to about 2500 Å, and a total thickness of an insulating layer between the compensation channel region C3 and the compensation gate electrode G3 of the compensation thin-film transistor T3 and between the first initialization channel region C4 and the first initialization gate electrode G4 of the first initialization thin-film transistor T4 may be provided in a range of about 500 Å to about 1000 Å. For example, the total thickness of the insulating layer between the driving channel region C1 and the driving gate electrode G1 of the driving thin-film transistor T1 may be larger than the total thickness of the insulating layer between the compensation channel region C3 and the compensation gate electrode G3 of the compensation thin-film transistor T3 and between the first initialization channel region C4 and the first initialization gate electrode G4 of the first initialization thin-film transistor T4. Accordingly, while the driving thin-film transistor T1 has an extensive driving range, the subthreshold currents of the compensation thin-film transistor T3 and the first initialization thin-film transistor T4 may be reduced.

In an embodiment, the first insulating layer 111 and the second insulating layer 112 may include a same material or a similar material. For example, both the first insulating layer 111 and the second insulating layer 112 may include silicon oxide.

In an embodiment, a dielectric constant of a material included in the second insulating layer 112 may be greater than a dielectric constant of a material included in the first insulating layer 111. For example, the first insulating layer 111 may include silicon oxide, and the second insulating layer 112 may include silicon nitride. A dielectric constant of silicon oxide is about 3.7, and a dielectric constant of silicon nitride is about 7.5.

Because the second insulating layer 112 between the compensation channel region C3 and the compensation gate electrode G3 of the compensation thin-film transistor T3 may include silicon nitride having a high dielectric constant, a subthreshold current $I_{off}$ of the compensation thin-film transistor T3 may be reduced, and an on current $I_{on}$ of the compensation thin-film transistor T3 may be increased. Also, because the second insulating layer 112 between the compensation channel region C3 and the compensation gate electrode G3 of the compensation thin-film transistor T3 may include silicon nitride having a high dielectric constant, the compensation thin-film transistor T3 may sensitively respond to an electrical signal applied to the compensation gate electrode G3.

Because the second insulating layer 112 between the first initialization channel region C4 and the first initialization gate electrode G4 of the first initialization thin-film transistor T4 may include silicon nitride having a high dielectric constant, a subthreshold current $I_{off}$ of the first initialization thin-film transistor T4 may be reduced, and an on current $I_{on}$ of the first initialization thin-film transistor T4 may be increased. Also, because the second insulating layer 112 between the first initialization channel region C4 and the first initialization gate electrode G4 of the first initialization thin-film transistor T4 may include silicon nitride having a high dielectric constant, the first initialization thin-film transistor T4 may sensitively respond to an electrical signal applied to the first initialization gate electrode G4.

In an embodiment, the first insulating layer 111 may include silicon oxide, and the second insulating layer 112 may include low-hydrogen silicon nitride having hydrogen content lower than that of general silicon nitride. For example, low-hydrogen silicon nitride may have hydrogen content in a range of about 3% to about 10% lower than that of general silicon nitride. Because the second insulating layer 112 may include low-hydrogen silicon nitride having a high dielectric constant, the subthreshold currents $I_{off}$ of the compensation thin-film transistor T3 and the first initialization thin-film transistor T4 may be reduced, and the on currents $I_{on}$ thereof may be increased.

Referring to FIG. 4, in an embodiment, a width of the driving semiconductor layer A1 of the driving thin-film transistor T1 may be greater than a width of the compensation semiconductor layer A3 of the compensation thin-film transistor T3 and a width of the first initialization semiconductor layer A4 of the first initialization thin-film transistor T4.

In more detail, the driving channel region C1 of the driving thin-film transistor T1 may have a first width W1, and the compensation channel region C3 of the compensation thin-film transistor T3 and the first initialization channel region C4 of the first initialization thin-film transistor T4 may have a second width W2. The first width W1 of the driving channel region C1 of the driving thin-film transistor T1 may be greater than the second width W2 of the compensation channel region C3 of the compensation thin-film transistor T3 and the first initialization channel region C4 of the first initialization thin-film transistor T4.

In an embodiment, widths of the compensation channel region C3 of the compensation thin-film transistor T3 and the first initialization channel region C4 of the first initialization thin-film transistor T4 may be less than or equal to about 2 μm, less than or equal to about 1.5 μm, or less than or equal to about 1.2 μm. Various modifications may be made. For example, the widths of the compensation channel region C3 of the compensation thin-film transistor T3 and the first initialization channel region C4 of the first initialization thin-film transistor T4 may be about 1.0 μm.

In general, because the subthreshold current $I_{off}$ is proportional to a width of the channel region and inversely proportional to a length of the channel region, the second width W2 of the compensation channel region C3 of the compensation thin-film transistor T3 and the first initialization channel region C4 of the first initialization thin-film transistor T4 is less than the first width W1 of the driving channel region C1 of the driving thin-film transistor T1, or the second width W2 of the compensation channel region C3 of the compensation thin-film transistor T3 and the first initialization channel region C4 of the first initialization thin-film transistor T4 is about 1 μm, and thus, the subthreshold currents $I_{off}$ of the compensation channel region C3 of the compensation thin-film transistor T3 and the first initialization channel region C4 of the first initialization thin-film transistor T4 may be reduced.

In an embodiment, by controlling the thickness of the insulating layer between the channel region and the gate electrode, controlling the material included in the insulating layer, or controlling the width of the channel region, the subthreshold currents $I_{off}$ corresponding to leakage currents of the compensation thin-film transistor T3 and the first initialization thin-film transistor T4 are reduced, and the on currents $I_{on}$ of the compensation thin-film transistor T3 and the first initialization thin-film transistor T4 are increased, and thus, the display apparatus may prevent a change in luminance of the organic light-emitting diode from occurring and may display high-quality images.

FIGS. 6 to 11 and FIGS. 13 to 17 are schematic cross-sectional views of a method of manufacturing a display apparatus, according to an embodiment. In detail, the display apparatus according to an embodiment may include pixel circuits PC (see FIG. 2), and each pixel circuit PC may include thin-film transistors T1 to T7. FIGS. 6 to 11 and FIGS. 13 to 17 are schematic cross-sectional views sequentially illustrating a method of manufacturing the driving thin-film transistor T1, the compensation thin-film transistor T3, and the first initialization thin-film transistor T4 among the thin-film transistors T1 to T7. In an embodiment, the switching thin-film transistor T2, the operation control thin-film transistor T5, the emission control thin-film transistor T6, and the second initialization thin-film transistor T7 may be manufactured by the same manufacturing method as the driving thin-film transistor T1. However, one or more embodiments are not limited thereto. For example, some or a number of the switching thin-film transistor T2, the operation control thin-film transistor T5, the light emission control thin-film transistor T6, and the second initialization thin-film transistor T7 may be manufactured by the same manufacturing method as the driving thin-film transistor T1, and the rest may be manufactured by the same manufacturing method as the compensation thin-film transistor T3.

As described above with reference to FIGS. 2 and 3, the pixel circuit PC may include seven thin-film transistors. However, one or more embodiments are not limited thereto. The number of thin-film transistors included in each pixel circuit PC may vary. For example, each pixel circuit PC may include three thin-film transistors. FIGS. 6 to 11 and FIGS. 13 to 17 illustrate a method of manufacturing the driving thin-film transistor T1 and the compensation thin-film transistor T3.

Referring to FIGS. 6 to 11 and FIGS. 13 to 17, the method of manufacturing a display apparatus according to an embodiment may include forming a first photosensitive pattern 50a and a second photosensitive pattern 50b having different thicknesses on an active layer 106, forming a driving semiconductor layer A1 and a compensation semiconductor layer A3 by etching the active layer 106 using the first photosensitive pattern 50a and the second photosensitive pattern 50b as masks, exposing an upper surface A1a of the driving semiconductor layer A1 by etching the first photosensitive pattern 50a and forming a third photosensitive pattern 50c by etching at least a portion of the second photosensitive pattern 50b, forming a first insulating layer 111 on the driving semiconductor layer A1 and the third photosensitive pattern 50c, exposing an upper surface A3a of the compensation semiconductor layer A3 by stripping the third photosensitive pattern 50c, and forming a second insulating layer 112 on the first insulating layer 111 and the compensation semiconductor layer A3.

Figure 6:
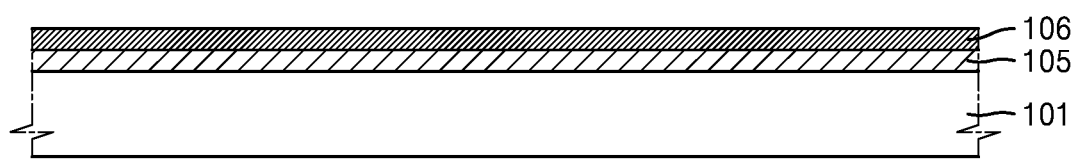
FIGS. 6 to 11 and FIGS. 13 to 17 are schematic cross-sectional views of a method of manufacturing a display apparatus, according to an embodiment.

Referring to FIG. 6, a buffer layer 105 may be formed on the substrate 101, and the active layer 106 may be formed on the buffer layer 105. In an embodiment, the active layer 106 may include a polycrystalline silicon layer. For example, after an amorphous silicon layer is formed on the substrate 101, the amorphous silicon layer may be crystallized by using various methods, such as rapid thermal annealing (RTA), solid phase crystallization (SPC), excimer laser annealing (ELA), metal induced crystallization (MIC), metal induced lateral crystallization (MILC), and sequential lateral solidification (SLS), so that the active layer 106 including a polycrystalline silicon layer may be formed.

In an embodiment, the active layer 106 may have a thickness of about 1400 Å in a direction perpendicular to the substrate 101. However, one or more embodiments are not limited thereto.

Figure 7:
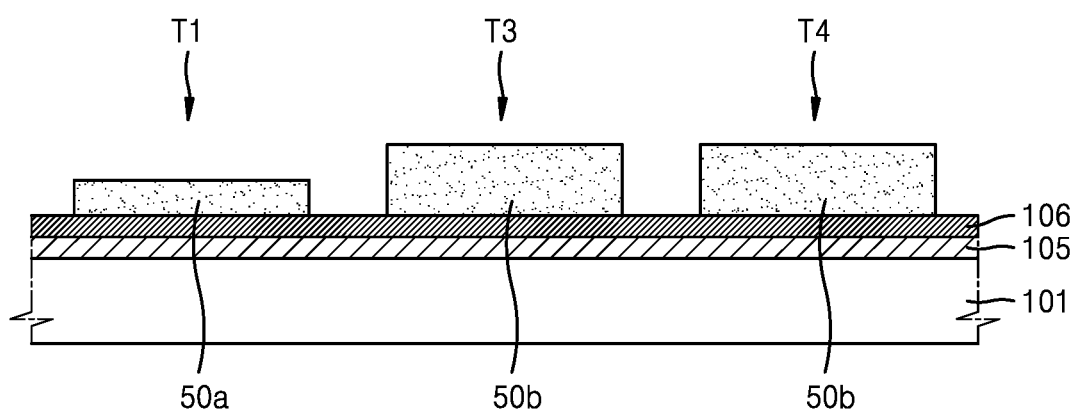

Thereafter, referring to FIG. 7, the first photosensitive pattern 50a and the second photosensitive pattern 50b having different thicknesses may be formed on the active layer 106. In an embodiment, after a photoresist layer is formed on the active layer 106, the first photosensitive pattern 50a and the second photosensitive pattern 50b having different thicknesses may be formed through a photolithography process using a half-tone mask. A thickness of the second photosensitive pattern 50b may be greater than a thickness of the first photosensitive pattern 50a. For example, the second photosensitive pattern 50b may be approximately twice as thick as the first photosensitive pattern 50a.

In an embodiment, the first photosensitive pattern 50a may be formed at a position where the driving thin-film transistor T1 is to be formed, and the second photosensitive pattern 50b may be formed at positions where the compensation thin-film transistor T3 and the first initialization thin-film transistor T4 are to be formed, respectively. Though not illustrated, photosensitive patterns may be formed at positions where the remaining thin-film transistors are to be formed.

Figure 8:
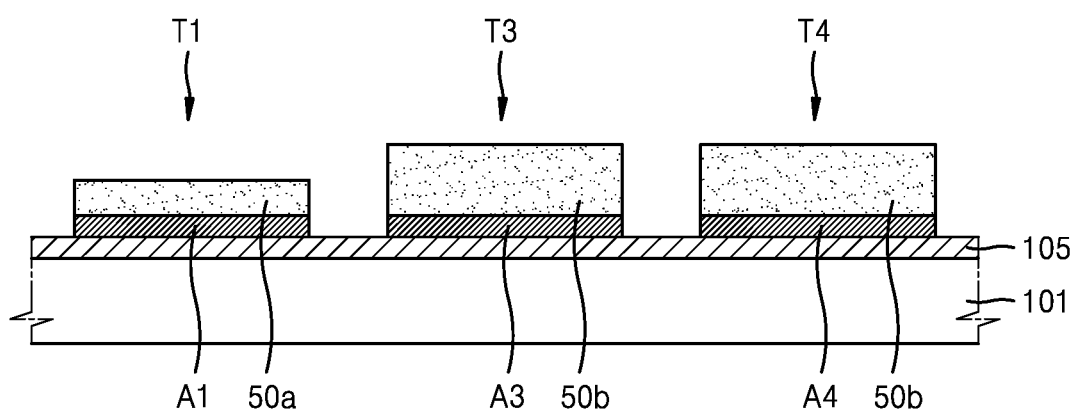

Thereafter, referring to FIG. 8, the driving semiconductor layer A1, the compensation semiconductor layer A3, and the first initialization semiconductor layer A4 may be formed by etching the active layer 106 using the first photosensitive pattern 50a and the second photosensitive pattern 50b as masks. In detail, the driving semiconductor layer A1, the compensation semiconductor layer A3, and the first initialization semiconductor layer A4 may be formed by etching the active layer 106 using the first photosensitive pattern 50a and the second photosensitive pattern 50b, which are formed on the active layer 106, as etching masks. Dry etching or wet etching may be used for the etching.

Though not illustrated, semiconductor layers of the remaining thin-film transistors may be formed by using the photosensitive patterns as masks.

Figure 9:
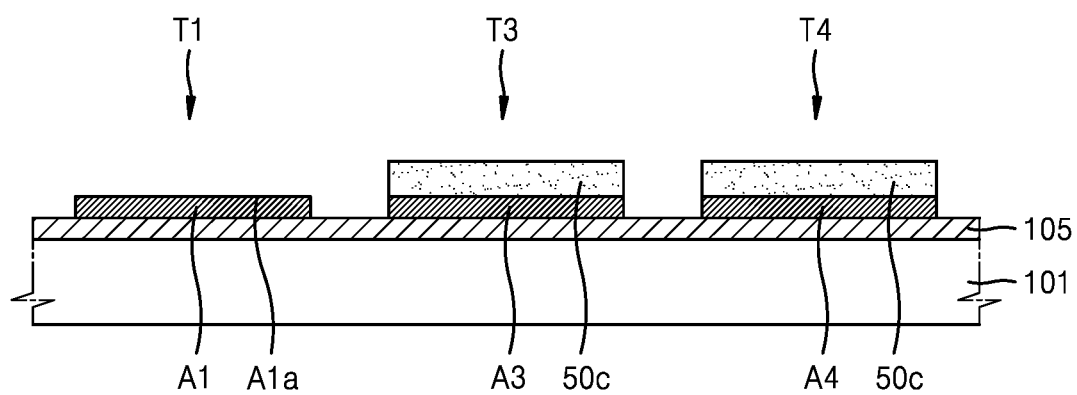

Thereafter, referring to FIG. 9, an upper surface of the driving semiconductor layer A1 may be exposed by etching the first photosensitive pattern 50a, and the third photosensitive pattern 50c may be formed by etching at least the portion of the second photosensitive pattern 50b. In detail, after the forming of the driving semiconductor layer A1, the compensation semiconductor layer A3, and the first initialization semiconductor layer A4 by etching the active layer 106 using the first photosensitive pattern 50a and the second photosensitive pattern 50b as the etching masks, the first photosensitive pattern 50a and the second photosensitive pattern 50b may be entirely etched (removed).

The first photosensitive pattern 50a and the second photosensitive pattern 50b may be etched (removed) by a same thickness. Because the first photosensitive pattern 50a is completely etched (completely removed) and the thickness of the second photosensitive pattern 50b is approximately twice that of the first photosensitive pattern 50a, the second photosensitive pattern 50b is etched (removed) by the thickness of the first photosensitive pattern 50a, so that the third photosensitive pattern 50c may be formed. Dry etching may be used for the etching.

Because the first photosensitive pattern 50a is completely etched (completely removed), at least a portion of the upper surface A1a of the driving semiconductor layer A1 positioned or disposed under or below the first photosensitive pattern 50a may be exposed, and the second photosensitive pattern 50b is not completely etched (completely removed), but only the thickness thereof is reduced, and thus, the compensation semiconductor layer A3 and the first initialization semiconductor layer A4 may be positioned or disposed under or below the second photosensitive pattern 50b. For example, upper surfaces of the compensation semiconductor layer A3 and the first initialization semiconductor layer A4 may not be exposed.

Figure 10:
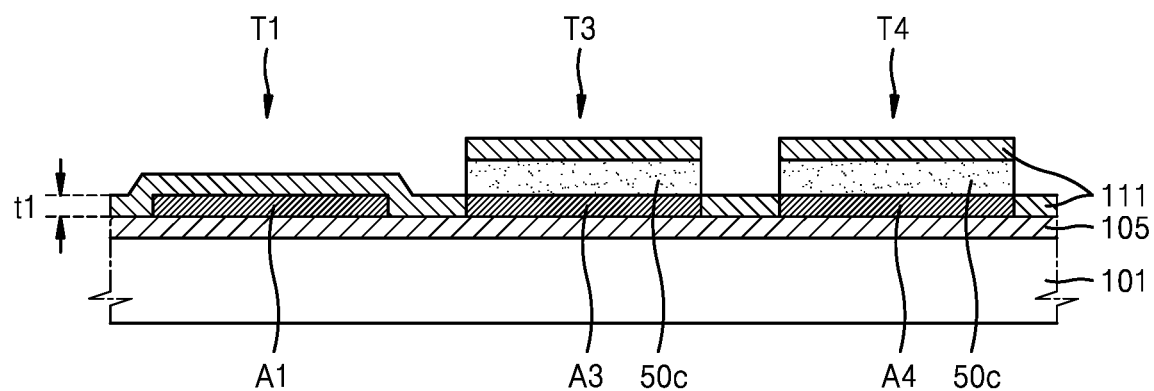

Thereafter, referring to FIG. 10, the first insulating layer 111 may be formed on the driving semiconductor layer A1 and the third photosensitive pattern 50c. In detail, after the upper surface A1a of the driving semiconductor layer A1 is exposed by etching the first photosensitive pattern 50a, and the third photosensitive pattern 50c is formed by etching at least the portion of the second photosensitive pattern 50b, the first insulating layer 111 may be entirely formed. Accordingly, the first insulating layer 111 may be entirely formed on the upper surface A1a of the driving semiconductor layer A1, the buffer layer 105, and the third photosensitive pattern 50c.

In an embodiment, the first insulating layer 111 may have a first thickness t1 in a direction perpendicular to the substrate 101. The first thickness t1 may be in a range of about 1000 Å to about 1500 Å. In case that a thickness of the first insulating layer 111 (for example, the first thickness t1) is less than about 1000 Å, as will be described below, a total thickness of an insulating layer between the driving channel region C1 (see FIG. 14) and the driving gate electrode G1 (see FIG. 14) of the driving thin-film transistor T1 is small, and thus, the driving range of the driving thin-film transistor T1 may be narrowed. In contrast, the thickness of the first insulating layer 111 (for example, the first thickness t1) is greater than about 1500 Å, the total thickness of the insulating layer between the driving channel region C1 and the driving gate electrode G1 of the driving thin-film transistor T1 is too large, and thus, it may be difficult to control the driving gate electrode G1.

In an embodiment, the first insulating layer 111 may include silicon oxide.

In an embodiment, after the exposing of the upper surface A1a of the driving semiconductor layer A1 by etching (removing) the first photosensitive pattern 50a, the first insulating layer 111 may be formed after a first cleaning process is performed on the upper surface A1a of the driving semiconductor layer A1.

In an embodiment, the first cleaning process may refer to a cleaning process using a solution in which ozone ($O_3$) is dissolved in an aqueous hydrofluoric acid (HF) solution, or may refer to a cleaning process using an aqueous solution in which ozone ($O_3$) is dissolved after cleaning with an aqueous HF solution. A concentration of HF included in the aqueous solution used in the first cleaning process may be about 0.5%. In case that the concentration of HF increases, the upper surface A1a of the driving semiconductor layer A1 may be partially etched.

Figure 11:
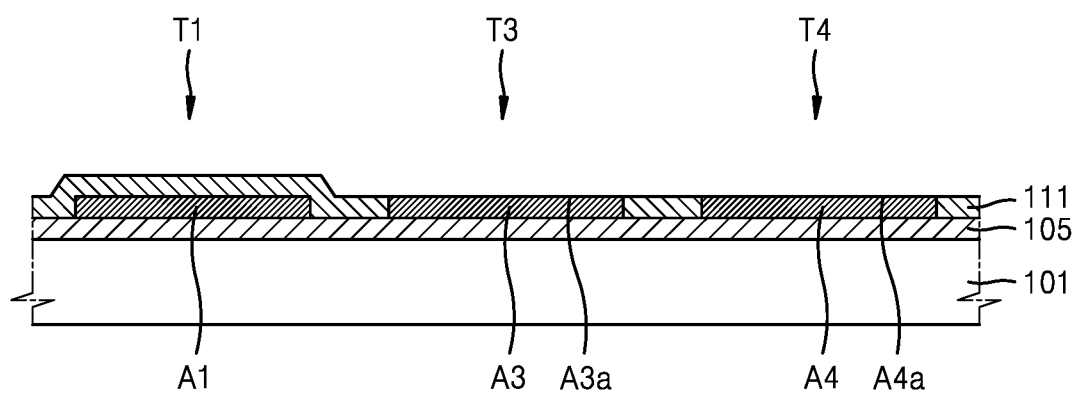

Thereafter, referring to FIG. 11, the upper surface A3a of the compensation semiconductor layer A3 and an upper surface A4a of the first initialization semiconductor layer A4 may be exposed by stripping the third photosensitive pattern 50c. In case that the third photosensitive pattern 50c is stripped, the first insulating layer 111 formed on the third photosensitive pattern 50c may also be removed.

Accordingly, the upper surface A3a of the compensation semiconductor layer A3 and the upper surface A4a of the first initialization semiconductor layer A4 may be exposed to the outside by removing the third photosensitive pattern 50c positioned or disposed on the upper surface A3a of the compensation semiconductor layer A3 and the upper surface A4a of the first initialization semiconductor layer A4.

Also, in an embodiment, the compensation semiconductor layer A3 and/or the first initialization semiconductor layer A4 may not overlap the first insulating layer 111. For example, the first insulating layer 111 may not be positioned or disposed on the upper surface A3a of the compensation semiconductor layer A3 and the upper surface A4a of the first initialization semiconductor layer A4.

Therefore, as will be described below, a thickness of an insulating layer between the compensation semiconductor layer A3 and the compensation gate electrode G3 may be reduced, and a thickness of an insulating layer between the first initialization semiconductor layer A4 and the first initialization gate electrode G4 may be reduced. In detail, a thickness of an insulating layer between the compensation channel region C3 of the compensation semiconductor layer A3 and the compensation gate electrode G3 may be reduced, and a thickness of an insulating layer between the first initialization channel region C4 of the first initialization semiconductor layer A4 and the first initialization gate electrode G4 may be reduced.

Figure 12:
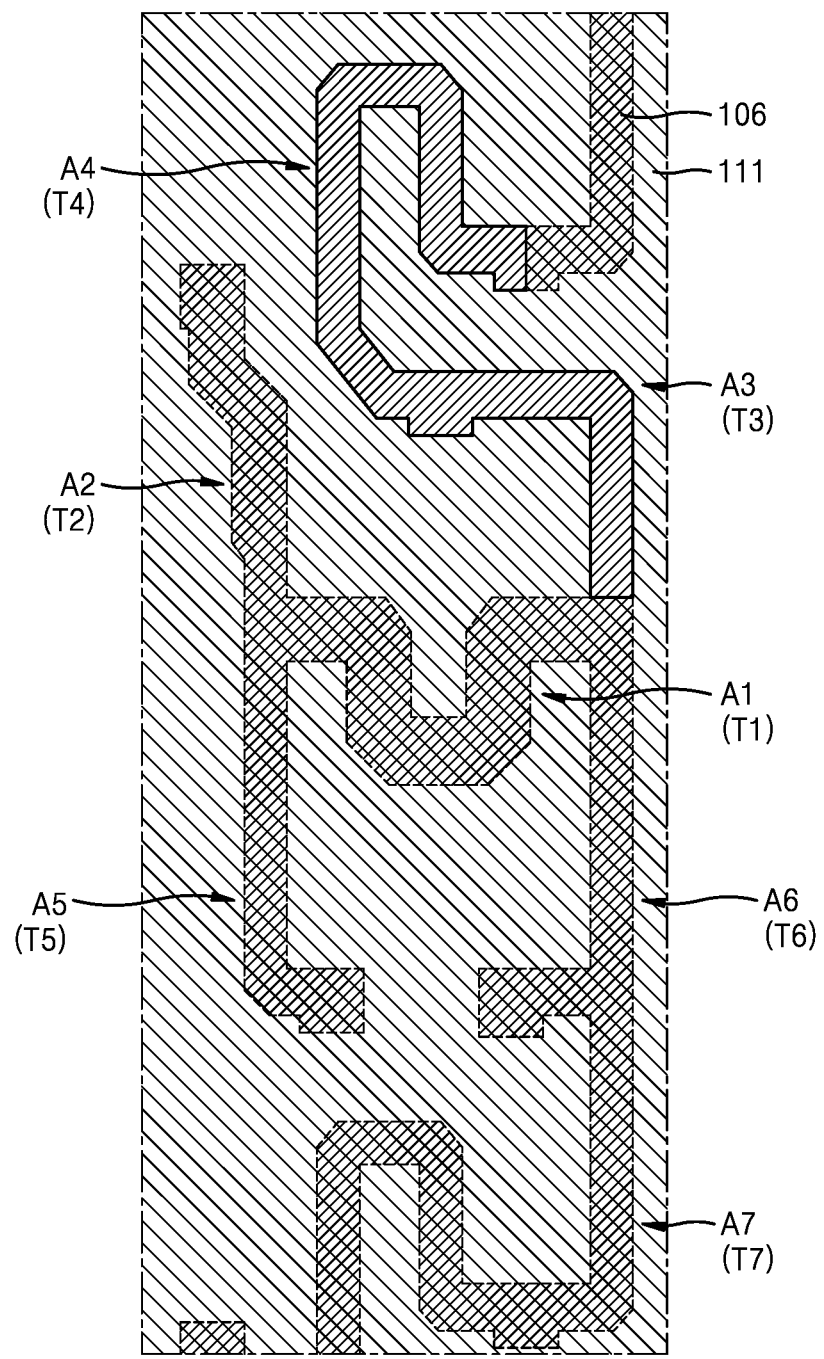
FIG. 12 is a schematic plan view of a method of manufacturing a display apparatus, according to an embodiment.

FIG. 12 is a schematic plan view of the method of manufacturing the display apparatus, according to an embodiment. FIG. 12 is a diagram for describing that the first insulating layer 111 may be arranged or disposed on the driving semiconductor layer A1, and the first insulating layer 111 may not be arranged or disposed on the compensation semiconductor layer A3 and the first initialization semiconductor layer A4.

Referring to FIG. 12, in an embodiment, the first insulating layer 111 may be arranged or disposed on the driving semiconductor layer A1, and may not be arranged or disposed on the compensation semiconductor layer A3 and the first initialization semiconductor layer A4. For example, the first insulating layer 111 may at least partially overlap (or completely overlap) the driving semiconductor layer A1, but may not overlap (or completely overlap) the compensation semiconductor layer A3 and the first initialization semiconductor layer A4.

Also, the first insulating layer 111 may be arranged or disposed on the switching semiconductor layer A2, the operation control semiconductor layer A5, the emission control semiconductor layer A6, and the second initialization semiconductor layer A7. For example, the first insulating layer 111 may at least partially overlap (or completely overlap) the switching semiconductor layer A2, the operation control semiconductor layer A5, the emission control semiconductor layer A6, and the second initialization semiconductor layer A7. However, one or more embodiments are not limited thereto.

Figure 13:
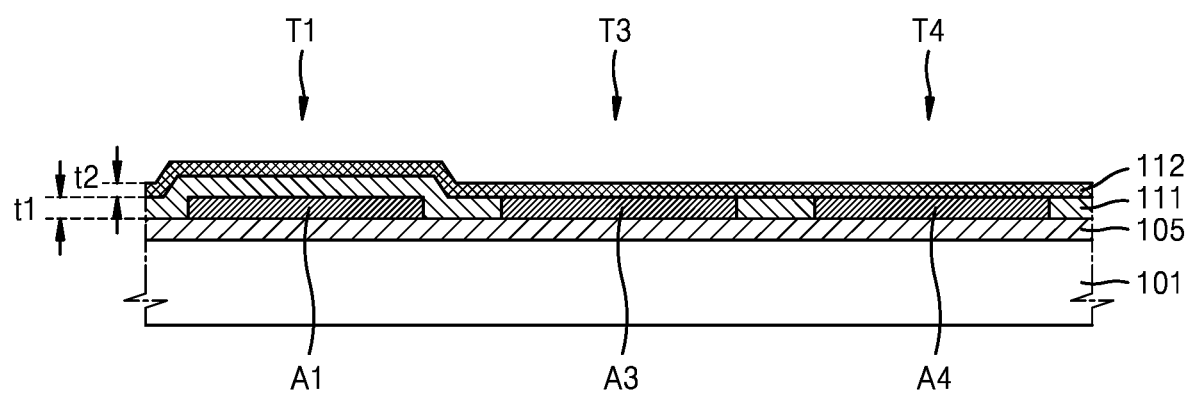

Thereafter, referring to FIG. 13, the second insulating layer 112 may be formed on the first insulating layer 111, the compensation semiconductor layer A3 and the first initialization semiconductor layer A4. In detail, after the third photosensitive pattern 50c is stripped, the second insulating layer 112 may be entirely formed. Accordingly, the second insulating layer 112 may be entirely formed on the first insulating layer 111, the upper surface A3a of the compensation semiconductor layer A3, and the upper surface A4a of the first initialization semiconductor layer A4.

In an embodiment, the second insulating layer 112 may have a second thickness t2 in a direction perpendicular to the substrate 101. The second thickness t2 may be in a range of about 500 Å to about 1000 Å. In case that a thickness of the second insulating layer 112 (for example, the second thickness t2) is less than about 500 Å, a gap between the compensation channel region C3 (see FIG. 14) and the compensation gate electrode G3 (see FIG. 14) of the compensation thin-film transistor T3 and a gap between the first initialization channel region C4 (see FIG. 14) and the first initialization gate electrode G4 (see FIG. 14) of the first initialization thin-film transistor T4 are too close, and thus, subthreshold currents may be increased. In contrast, in case that the thickness of the second insulating layer 112 (for example, the second thickness t2) is greater than about 1000 Å, the gap between the compensation channel region C3 and the compensation gate electrode G3 of the compensation thin-film transistor T3 and the gap between the first initialization channel region C4 and the first initialization gate electrode G4 of the first initialization thin-film transistor T4 are too far, and thus, the subthreshold currents may be increased.

In an embodiment, the second insulating layer 112 may include silicon oxide or silicon nitride. In an embodiment, the first insulating layer 111 and the second insulating layer 112 may include a same material or a similar material. For example, both the first insulating layer 111 and the second insulating layer 112 may include silicon oxide.

In an embodiment, a dielectric constant of a material included in the second insulating layer 112 may be greater than a dielectric constant of a material included in the first insulating layer 111. For example, the first insulating layer 111 may include silicon oxide, and the second insulating layer 112 may include silicon nitride.

Because the second insulating layer 112 between the compensation channel region C3 and the compensation gate electrode G3 of the compensation thin-film transistor T3 may include silicon nitride having a high dielectric constant, a subthreshold current $I_{off}$ of the compensation thin-film transistor T3 may be reduced, and an on current $I_{on}$ of the compensation thin-film transistor T3 may be increased. Also, because the second insulating layer 112 between the compensation channel region C3 and the compensation gate electrode G3 of the compensation thin-film transistor T3 may include silicon nitride having a high dielectric constant, the compensation thin-film transistor T3 may sensitively respond to an electrical signal applied to the compensation gate electrode G3.

By way of example, in an embodiment, because the second insulating layer 112 between the first initialization channel region C4 and the first initialization gate electrode G4 of the first initialization thin-film transistor T4 may include silicon nitride having a high dielectric constant, a subthreshold current $I_{off}$ of the first initialization thin-film transistor T4 may be reduced, and an on current $I_{on}$ of the first initialization thin-film transistor T4 may be increased.

By way of example, in an embodiment, the first insulating layer 111 may include silicon oxide, and the second insulating layer may include low-hydrogen silicon nitride having hydrogen content lower than that of general silicon nitride. Because the second insulating layer 112 may include low-hydrogen silicon nitride having a high dielectric constant, the subthreshold currents $I_{off}$ of the compensation thin-film transistor T3 and the first initialization thin-film transistor T4 may be reduced, and the on currents $I_{on}$ thereof may be increased.

In an embodiment, after the exposing of the upper surface A3a of the compensation semiconductor layer A3 and/or the upper surface A4a of the first initialization semiconductor layer A4 by stripping the third photosensitive pattern 50c, the first insulating layer 111 may be formed after a second cleaning process is performed on the upper surface A3a of the compensation semiconductor layer A3 and/or the upper surface A4a of the first initialization semiconductor layer A4.

In an embodiment, the second cleaning process may refer to a cleaning process using a solution in which ozone ($O_3$) is dissolved in an aqueous HF solution, or may refer to a cleaning process using an aqueous solution in which ozone ($O_3$) is dissolved after cleaning with an aqueous HF solution.

In case that the upper surface A3a of the compensation semiconductor layer A3 and/or the upper surface A4a of the first initialization semiconductor layer A4 are cleaned by using an aqueous solution with a high HF concentration, stains may be formed so that characteristics of a thin-film transistor may deteriorate. Accordingly, the concentration of HF used in the second cleaning process may be lower than the concentration of HF used in the first cleaning process. For example, the concentration of HF included in the aqueous solution used in the second cleaning process may be about 0.1%.

In an embodiment, the driving semiconductor layer A1 of the driving thin-film transistor T1 may be cleaned by using an aqueous HF solution having a concentration of about 0.5%, and the compensation and first initialization semiconductor layers A3 and A4 of the compensation thin-film transistor T3 and the first initialization thin-film transistor T4 may be cleaned by using an aqueous HF solution having a concentration of about 0.1%. Accordingly, by performing a cleaning process by varying cleaning conditions of the driving thin-film transistor T1 and cleaning conditions of the compensation thin-film transistor T3 and the first initialization thin-film transistor T4, characteristics of the driving thin-film transistor T1 and characteristics of the compensation thin-film transistor T3 and the first initialization thin-film transistor T4 may be separated.

Figure 14:
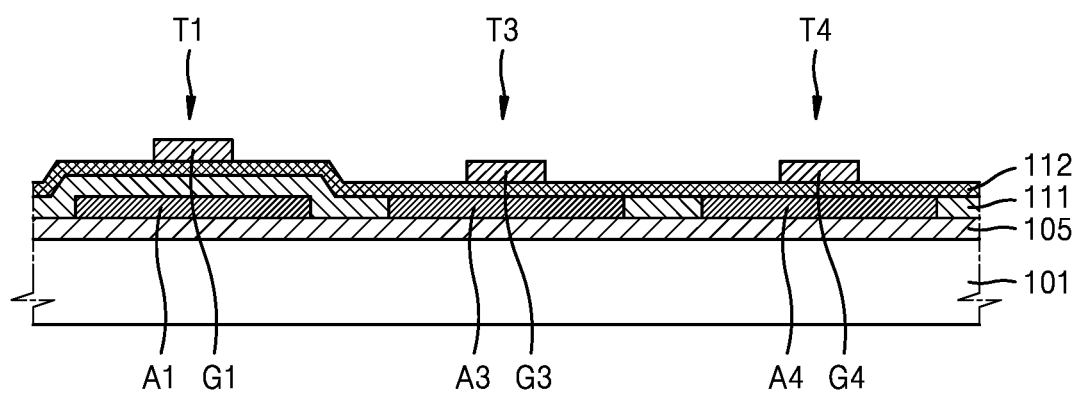

Thereafter, referring to FIG. 14, forming a gate electrode on the second insulating layer 112 may be performed. In detail, the driving gate electrode G1, the compensation gate electrode G3, and the first initialization gate electrode G4 may be formed on the second insulating layer 112. Though not illustrated, gate electrodes of the remaining thin-film transistors may also be formed on the second insulating layer 112.

In an embodiment, the driving gate electrode G1 may at least partially overlap the driving semiconductor layer A1, the compensation gate electrode G3 may at least partially overlap the compensation semiconductor layer A3, and the first initialization gate electrode G4 may at least partially overlap the first initialization semiconductor layer A4.

Though it is illustrated in FIG. 14 that one compensation gate electrode G3 and one first initialization gate electrode G4 are provided, one or more embodiments are not limited thereto. In an embodiment, the compensation gate electrode G3 may be provided as a dual gate electrode. For example, in case that the compensation gate electrode G3 is provided as a dual gate electrode, the compensation gate electrode G3 may be provided as a first compensation gate electrode and a second compensation gate electrode, which are arranged or disposed on a same layer. Also, in an embodiment, the first initialization gate electrode G4 may be provided as a dual gate electrode. For example, in case that the first initialization gate electrode G4 is provided as a dual gate electrode, the first initialization gate electrode G4 may be provided as a $(1-1)^{st}$ initialization gate electrode and a $(1-2)^{nd}$ initialization gate electrode, which are arranged or disposed on a same layer.

Figure 15:
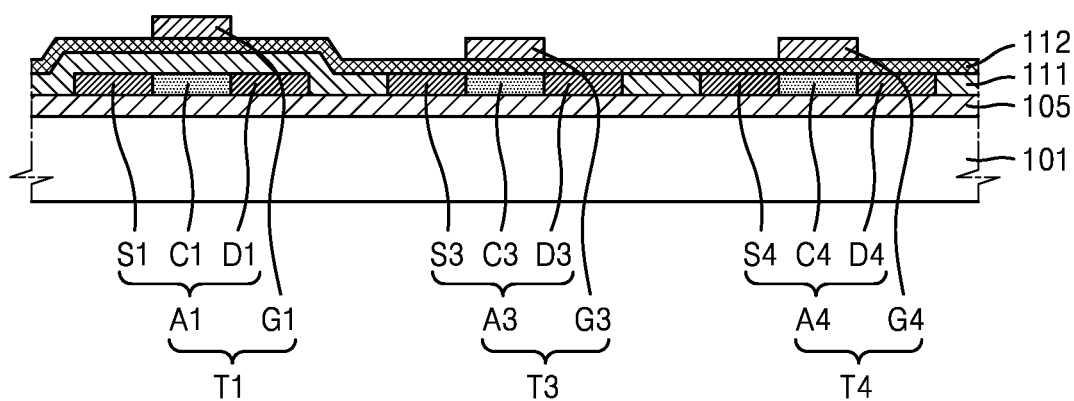

Thereafter, referring to FIG. 15, the driving source region S1 the driving drain region D1 of the driving thin-film transistor T1 may be formed by using impurity doping. A region of the driving semiconductor layer A1 overlapping the driving gate electrode G1 may be formed as the driving channel region C1. Accordingly, a portion of the driving semiconductor layer A1 is doped with impurities by using impurity doping, so that the driving semiconductor layer A1 may be divided into the driving source region S1, the driving channel region C1, and the driving drain region D1.

Also, the compensation source region S3 and the compensation drain region D3 of the compensation thin-film transistor T3 may be formed by using impurity doping. A region of the compensation semiconductor layer A3 overlapping the compensation gate electrode G3 may be formed as the compensation channel region C3. Accordingly, a portion of the compensation semiconductor layer A3 is doped with impurities by using impurity doping, so that the compensation semiconductor layer A3 may be divided into the compensation source region S3, the compensation channel region C3, and the compensation drain region D3.

Also, the first initialization source region S4 and the first initialization drain region D4 of the first initialization thin-film transistor T4 may be formed by using impurity doping. A region of the first initialization semiconductor layer A4 overlapping the first initialization gate electrode G4 may be formed as the first initialization channel region C4. Accordingly, a portion of the first initialization semiconductor layer A4 is doped with impurities by using impurity doping, so that the first initialization semiconductor layer A4 may be divided into the first initialization source region S4, the first initialization channel region C4, and the first initialization drain region D4.

In an embodiment, the width of the driving semiconductor layer A1 of the driving thin-film transistor T1 may be greater than the width of the compensation semiconductor layer A3 of the compensation thin-film transistor T3 and the width of the first initialization semiconductor layer A4 of the first initialization thin-film transistor T4.

Though not illustrated, semiconductor layers of the remaining thin-film transistors may also be doped and divided into source regions, channel regions, and drain regions.

Figure 16:
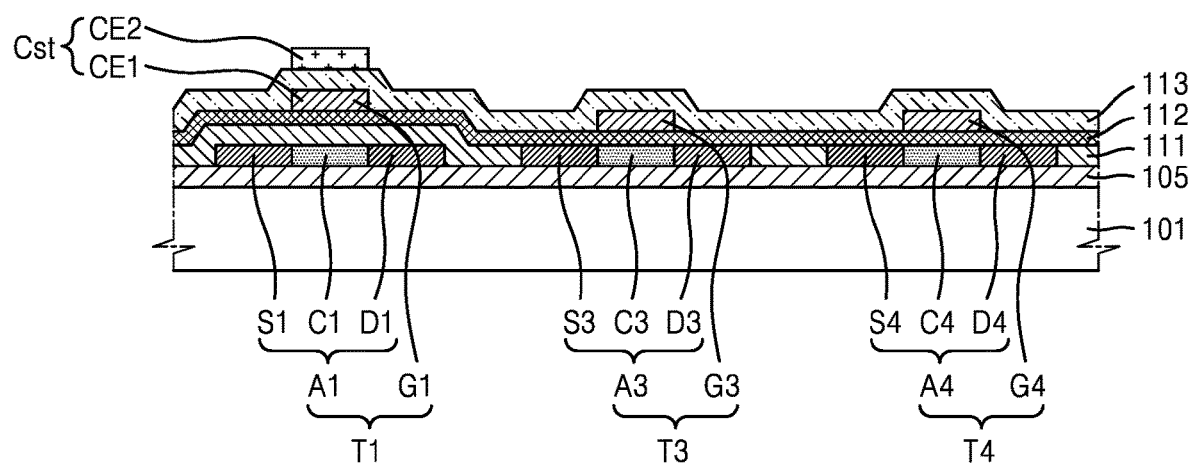

Thereafter, referring to FIG. 16, the third insulating layer 113 may be formed to cover or overlap a gate electrode, and the second electrode CE2 of the storage capacitor Cst may be formed on the third insulating layer 113.

In an embodiment, the first electrode CE1 of the storage capacitor Cst may be formed as a single body with the driving gate electrode G1 of the driving thin-film transistor T1 or may be integral with each other. For example, the driving gate electrode G1 of the driving thin-film transistor T1 may function as the first electrode CE1 of the storage capacitor Cst. However, one or more embodiments are not limited thereto. The first electrode CE1 of the storage capacitor Cst may be positioned or disposed on the second insulating layer 112 as a separate element from the driving gate electrode G1 of the driving thin-film transistor T1.

Figure 17:
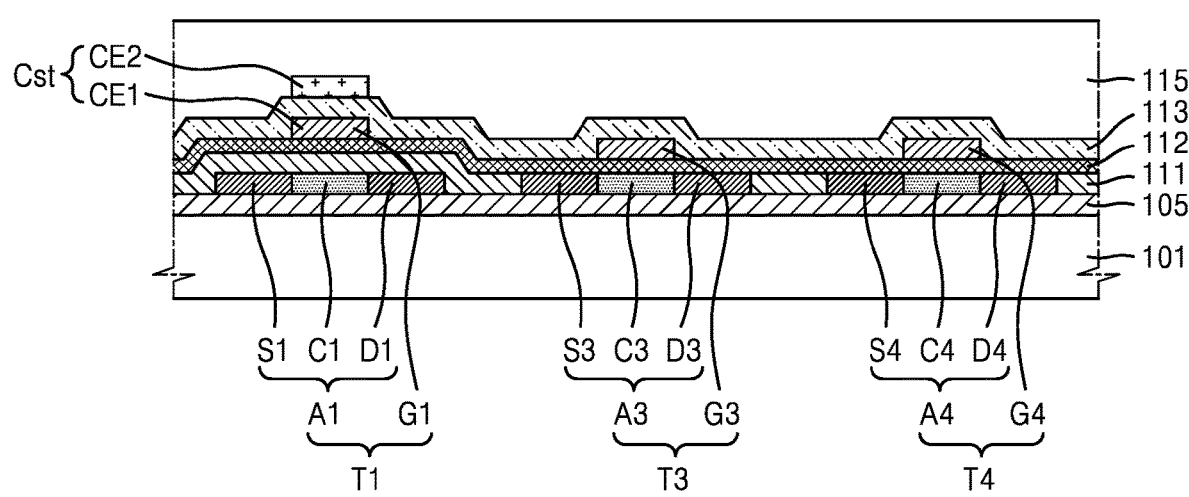

Thereafter, referring to FIG. 17, the interlayer insulating layer 115 may be formed on the second electrode CE2 of the storage capacitor Cst and the third insulating layer 113. As described above with reference to FIGS. 3 to 5, the data line DL (see FIG. 3), the power voltage line PL (see FIG. 5), the first and second initialization connection lines 1173a and 1173b (see FIG. 3), the node connection line 1174 (see FIG. 3), and the connection metal 1175 (see FIG. 3) may be formed on the interlayer insulating layer 115, and the planarization layer 117 (see FIG. 5), the pixel-defining layer 119 (see FIG. 5), and the organic light-emitting diode OLED (see FIG. 5) may be formed on the data line DL, the power voltage line PL, the first and second initialization connection lines 1173a and 1173b, the node connection line 1174, and the connection metal 1175. The organic light-emitting diode OLED may include the pixel electrode 210 (see FIG. 5), the intermediate layer 220 (see FIG. 5) including the emission layer, and the common electrode 230 (see FIG. 5).

In case that the thickness of the insulating layer between the compensation gate electrode G3 and the compensation channel region C3 of the compensation thin-film transistor T3 and the thickness of the insulating layer between the first initialization gate electrode G4 and the first initialization channel region C4 of the first initialization thin-film transistor T4 are reduced in order to reduce the subthreshold currents $I_{off}$ of the compensation thin-film transistor T3 and the first initialization thin-film transistor T4, the thickness of the insulating layer between the driving gate electrode G1 and the driving channel region C1 of the driving thin-film transistor T1 is also reduced, so that the driving range of the driving thin-film transistor T1 is narrowed. Accordingly, it may be difficult to control a gate voltage Vgs of the driving thin-film transistor T1 to have a rich gradation.

In an embodiment, in case that the aforementioned method of manufacturing the display apparatus is used, the thickness of the insulating layer between the compensation gate electrode G3 and the compensation channel region C3 of the compensation thin-film transistor T3 and the thickness of the insulating layer between the first initialization gate electrode G4 and the first initialization channel region C4 of the first initialization thin-film transistor T4 may be reduced without addition of a mask. Also, at the same time, the thickness of the insulating layer between the driving gate electrode G1 and the driving channel region C1 of the driving thin-film transistor T1 may be provided to be greater than the thickness of the insulating layer between the compensation gate electrode G3 and the compensation channel region C3 of the compensation thin-film transistor T3 and the thickness of the insulating layer between the first initialization gate electrode G4 and the first initialization channel region C4 of the first initialization thin-film transistor T4. Therefore, the subthreshold currents $I_{off}$ of the compensation thin-film transistor T3 and the first initialization thin-film transistor T4 may be reduced, the on currents $I_{on}$ of the compensation thin-film transistor T3 and the first initialization thin-film transistor T4 may be increased, the sensitivity of the compensation thin-film transistor T3 and the first initialization thin-film transistor T4 may be increased, and the driving range of the driving thin-film transistor T1 may be extended to express a rich gradation.

According to the one or more embodiments as described above, a display apparatus capable of displaying high-quality images and a method of manufacturing the same may be implemented. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope and as defined by the following claims.

What is claimed is:

1. A display apparatus comprising:
    a driving thin-film transistor including:
        a driving channel region; and
        a driving gate electrode that at least partially overlaps the driving channel region;
    a compensation thin-film transistor including:
        a compensation channel region; and
        a compensation gate electrode that at least partially overlaps the compensation channel region, the compensation thin-film transistor being diode-connected to the driving thin-film transistor in response to a voltage applied to the compensation gate electrode;
    a first insulating layer disposed between the driving channel region and the driving gate electrode of the driving thin-film transistor; and
    a second insulating layer disposed between the first insulating layer and the driving gate electrode and disposed between the compensation channel region and the compensation gate electrode of the compensation thin-film transistor, wherein a width of the compensation channel region of the compensation thin-film transistor is less than a width of the driving channel region of the driving thin-film transistor.

2. The display apparatus of claim 1, further comprising:
a first initialization thin-film transistor including:
   a first initialization channel region; and
   a first initialization gate electrode that at least partially overlaps the first initialization channel region,
wherein the first initialization thin-film transistor initializes a voltage of the driving gate electrode of the driving thin-film transistor in response to a voltage applied to the first initialization gate electrode.

3. The display apparatus of claim 1, wherein the first insulating layer does not overlap the compensation channel region of the compensation thin-film transistor.

4. The display apparatus of claim 2, wherein the first insulating layer does not overlap the first initialization channel region of the first initialization thin-film transistor.

5. The display apparatus of claim 1, further comprising:
   a third insulating layer overlapping the driving gate electrode of the driving thin-film transistor; and
   a storage capacitor including a first electrode and a second electrode that overlap each other,
   wherein the third insulating layer is disposed between the first electrode and the second electrode.

6. The display apparatus of claim 5, wherein the driving gate electrode of the driving thin-film transistor and the first electrode of the storage capacitor are integral with each other.

7. The display apparatus of claim 1, wherein the first insulating layer has a thickness in a range of about 1000 Å (angstroms) to about 1500 Å.

8. The display apparatus of claim 7, wherein the second insulating layer has a thickness in a range of about 500 Å to about 1000 Å.

9. The display apparatus of claim 1, wherein
the first insulating layer includes silicon oxide, and
the second insulating layer includes silicon oxide or silicon nitride.

10. A method of manufacturing a display apparatus, the method comprising:
   forming a first photosensitive pattern and a second photosensitive pattern of different thicknesses on an active layer;
   forming a driving semiconductor layer and a compensation semiconductor layer by using the first photosensitive pattern and the second photosensitive pattern as masks to etch the active layer;
   exposing an upper surface of the driving semiconductor layer by etching the first photosensitive pattern and forming a third photosensitive pattern by etching at least a portion of the second photosensitive pattern;
   forming a first insulating layer on the driving semiconductor layer and the third photosensitive pattern;
   exposing an upper surface of the compensation semiconductor layer by stripping the third photosensitive pattern; and
   forming a second insulating layer on the first insulating layer and the compensation semiconductor layer.

11. The method of claim 10, wherein a thickness of the second photosensitive pattern is greater than a thickness of the first photosensitive pattern.

12. The method of claim 10, wherein the first insulating layer has a thickness in a range of about 1000 Å to about 1500 Å.

13. The method of claim 12, wherein the second insulating layer has a thickness in a range of about 500 Å to about 1000 Å.

14. The method of claim 13, wherein
the first insulating layer includes silicon oxide, and
the second insulating layer includes silicon oxide or silicon nitride.

15. The method of claim 10, further comprising:
performing a first cleaning process on the upper surface of the driving semiconductor layer after the exposing of the upper surface of the driving semiconductor layer by etching the first photosensitive pattern.

16. The method of claim 15, further comprising:
performing a second cleaning process on the upper surface of the compensation semiconductor layer after the exposing of the upper surface of the compensation semiconductor layer by stripping the third photosensitive pattern.

17. The method of claim 16, wherein a concentration of HF (hydrofluoric acid) used in the second cleaning process is lower than a concentration of HF used in the first cleaning process.

18. The method of claim 10, further comprising:
forming a driving gate electrode and a compensation gate electrode on the second insulating layer after the forming of the second insulating layer on the first insulating layer and the compensation semiconductor layer.

19. The method of claim 18, wherein
the driving semiconductor layer includes a driving channel region overlapping the driving gate electrode,
the compensation semiconductor layer includes a compensation channel region overlapping the compensation gate electrode, and
a width of the compensation channel region is less than a width of the driving channel region.

20. The method of claim 10, wherein the compensation semiconductor layer does not overlap the first insulating layer.

* * * * *